US008760545B2

(12) United States Patent
Takimoto

(10) Patent No.: US 8,760,545 B2
(45) Date of Patent: Jun. 24, 2014

(54) SOLID-STATE IMAGING DEVICE, MANUFACTURING METHOD THEREFOR, SOLID-STATE IMAGING APPARATUS, AND IMAGE CAPTURING APPARATUS

(75) Inventor: Kaori Takimoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 160 days.

(21) Appl. No.: 13/154,004

(22) Filed: Jun. 6, 2011

(65) Prior Publication Data

US 2012/0008024 A1 Jan. 12, 2012

(30) Foreign Application Priority Data

Jul. 6, 2010 (JP) .................................. 2010-153640

(51) Int. Cl.
*H04N 3/14* (2006.01)
*H04N 5/335* (2011.01)
*H01L 27/148* (2006.01)
*H01L 21/00* (2006.01)

(52) U.S. Cl.
USPC ............................. 348/294; 257/228; 257/447

(58) Field of Classification Search
None
See application file for complete search history.

(56) References Cited

U.S. PATENT DOCUMENTS 6,528,156 B1 * 3/2003 Takizawa et al. ............. 428/323
8,035,708 B2   10/2011 Takizawa et al.
2008/0272419 A1 * 11/2008 Furukawa et al. ............ 257/292

FOREIGN PATENT DOCUMENTS

JP        2009-259934         11/2009

* cited by examiner

*Primary Examiner* — Albert Cutler
(74) *Attorney, Agent, or Firm* — Dentons US LLP

(57) ABSTRACT

A solid-state imaging device includes: a semiconductor substrate that has a light sensing portion which photoelectrically converts incident light; an infrared cut filter layer or a light shielding layer that is provided on a surface side opposite to a light receiving surface of the semiconductor substrate and is formed on substantially the entire surface of an area corresponding to an area in which the light sensing portion of the semiconductor substrate is formed; and a wiring layer that is provided on an upper layer of the infrared cut filter layer or the light shielding layer.

16 Claims, 19 Drawing Sheets

SOLID-STATE IMAGING DEVICE, MANUFACTURING METHOD THEREFOR, SOLID-STATE IMAGING APPARATUS, AND IMAGE CAPTURING APPARATUS

BACKGROUND

The present disclosure relates to a solid-state imaging device, a manufacturing method therefor, a solid-state imaging apparatus, and an image capturing apparatus. Specifically, the disclosure relates to a back-illuminated solid-state imaging device, a manufacturing method therefor, and a solid-state imaging apparatus and an image capturing apparatus using the solid-state imaging device.

In the past, in video cameras, digital still cameras, and the like, solid-state imaging apparatuses constituted by a CCD (Charge Coupled Device) or CMOS image sensor have come into widespread use. In recent years, in accordance with reductions in size and power consumption of video cameras, digital still cameras, and mobile phones equipped with cameras, CMOS solid-state imaging apparatuses have spread rapidly. In addition, in the CMOS solid-state imaging apparatuses, the front-illuminated type shown in FIG. 18 and the back-illuminated type shown in FIG. 19 have been known.

As shown in the schematic configuration diagram of FIG. 18, a front-illuminated solid-state imaging apparatus 111 includes a pixel region 113. In the region, a plurality of photodiodes PD, which constitutes a photoelectric conversion portion of a semiconductor substrate 112, is formed and a plurality of unit pixels 116, which is formed of a plurality of pixel transistors, is formed. Although the pixel transistors are not shown in the drawing, FIG. 18 shows gate electrodes 114, and thus schematically shows the presence of the pixel transistors.

Each photodiode PD is isolated by an element isolation region 115 formed of an impurity-diffused layer. In addition, a multilevel wiring layer 119, in which a plurality of wires 118 is disposed with an interlayer insulation film 117 interposed therebetween, is formed on the surface side of a semiconductor substrate 112 where the pixel transistors are formed. The wires 118 are formed in portions other than portions corresponding to the positions of the photodiodes PD.

On the multilevel wiring layer 119, an on-chip color filter 121 and an on-chip micro lens 122 are formed in this order with a planarization film 120 interposed therebetween. The on-chip color filter 121 is constituted by arranging each color filter of, for example, red (R), green (G), and blue (B).

In the front-illuminated solid-state imaging apparatus 111, the light L is incident from the side of the substrate surface, on which the multilevel wiring layer 119 is formed, as a light receiving surface 123.

On the other hand, as shown in the schematic configuration diagram of FIG. 19, a back-illuminated type solid-state imaging apparatus 131 includes the pixel region 113. In the region, a plurality of photodiodes PD, which constitutes a photoelectric conversion portion of a semiconductor substrate 112, is formed and a plurality of unit pixels 116, which is formed of a plurality of pixel transistors, is formed. Although the pixel transistors are not shown in the drawing, FIG. 19 shows gate electrodes 114, and thus schematically shows the presence of the pixel transistors.

Each photodiode PD is isolated by an element isolation region 115 formed of an impurity diffused layer. In addition, a multilevel wiring layer 119, in which a plurality of wires 118 is disposed with an interlayer insulation film 117 interposed therebetween, is formed on the surface side of a semiconductor substrate 112 where the pixel transistors are formed. In the back-illuminated type, the wires 118 can be formed regardless of the positions of the photodiodes PD.

Further, an insulation layer 128, the on-chip color filter 121, and the on-chip micro lens 122 are formed in this order on the backside of the semiconductor substrate 112 to which the photodiode PD faces.

In the back-illuminated solid-state imaging apparatus 131, the light L is incident from the backside of the substrate, which is the side opposite to the substrate surface on which the multilevel wiring layer 119 and the pixel transistor are formed, as a light receiving surface 132.

Incidentally, there is a demand for high integration of devices achieved by miniaturizing pixels. The above-mentioned front-illuminated solid-state imaging apparatus 111 has a structure in which the photodiodes PD receive light through spaces of the multilevel wiring layer 119. Hence, in accordance with miniaturization of pixels achieved by high integration, it becomes difficult to sufficiently secure the area of the light sensing portion because of obstacles such as wires. Accordingly, there are concerns about deterioration in sensitivity and an increase in shading.

In contrast, in the back-illuminated solid-state imaging apparatus 131, the light L is incident on the photodiodes PD without restriction of the multilevel wiring layer 119. Therefore, the opening of each photodiode PD can be set to be large, and thus high sensitivity is achieved.

However, in the back-illuminated solid-state imaging apparatus 131, it is necessary for the signal processing circuit, which is formed on the side opposite to the light receiving surface side, to read and process signal charges. For this reason, it is necessary to decrease the thickness of the semiconductor substrate 112. Hence, when long-wavelength light such as infrared rays is incident, the light, which is easily transmitted to the multilevel wiring layer 119 and is reflected by the multilevel wiring layer 119, is incident to the photodiodes PD of adjacent pixels, and thus this is likely to mix the colors of the light.

Hence, Japanese Unexamined Patent Application Publication No. 2009-259934 as shown in FIG. 20 proposes the technique of partially providing the infrared cut filter layer 150 between the photodiodes and the wiring layer. Due to the technique disclosed in Japanese Unexamined Patent Application Publication No. 2009-259934, it is possible to cut the infrared rays which are transmitted through the semiconductor substrate 112 and are reflected by the multilevel wiring layer 119, and it is also possible to prevent colors from mixing.

SUMMARY

In the technique disclosed in Japanese Unexamined Patent Application Publication No. 2009-259934, the infrared cut filter layer is formed in the middle of the semiconductor substrate 112. For this reason, inevitably the infrared cut filter layer is partially formed.

Hence, in the portion where the infrared cut filter layer is not formed, the infrared rays are transmitted, and are then reflected by the multilevel wiring layer. Thus, there is concern that the color mixing is caused.

The disclosure has been made in view of the above situation, and addresses the issue of providing a solid-state imaging device, a manufacturing method therefor, a solid-state imaging apparatus, and an image capturing apparatus capable of more sufficiently suppressing the color mixing caused by the light transmitted through the semiconductor substrate.

According to an embodiment of the disclosure, a solid-state imaging device includes: a semiconductor substrate that has a light sensing portion which photoelectrically converts incident light; an infrared cut filter layer or a light shielding layer that is provided on a surface side opposite to a light receiving surface of the semiconductor substrate and is formed on substantially the entire surface of an area corresponding to an area in which the light sensing portion of the semiconductor substrate is formed; and a wiring layer that is provided on an upper layer of the infrared cut filter layer or the light shielding layer.

Here, between the semiconductor substrate and the wiring layer, there is provided the infrared cut filter layer or the light shielding layer that is formed on the surface side opposite to the light receiving surface of the semiconductor substrate and is formed on substantially the entire surface of the area corresponding to the area in which the light sensing portion of the semiconductor substrate is formed. Thereby, it is possible to suppress the color mixing caused by the light reflected by the wiring layer.

In addition, it can be considered that the light reflected by the infrared cut filter layer or the light shielding layer is incident to the light sensing portion. However, since the infrared cut filter layer or the light shielding layer is provided closer to the semiconductor substrate than the wiring layer, it is considered that there is a low possibility that the reflected light is incident to the adjacent pixels.

Further, it is preferable that the infrared cut filter layer should include two laminated layers which have refractive indices different from each other. Specifically, for example, it is preferable that the infrared cut filter layer should have a laminated structure that the filter includes silicon dioxide, silicon nitride, titanium oxide, zirconium oxide, hafnium oxide, and tantalum oxide, or include at least one of the compounds. Besides, for example, it is also preferable that the infrared cut filter layer should include at least one of a phthalocyanine-based compound, an anthraquinone-based compound, a cyanine-based compound, a polymethylene-based compound, an aluminum-based compound, a diimmonium-based compound, an immonium-based compound, and an azo-based compound.

Further, according to another embodiment of the disclosure, a method of manufacturing a solid-state imaging device includes: forming an infrared cut filter layer or a light shielding layer on a surface side opposite to a light receiving surface of a semiconductor substrate having a light sensing portion which photoelectrically converts incident light and on substantially the entire surface of an area corresponding to an area in which the light sensing portion of the semiconductor substrate is formed; and forming a wiring layer on an upper layer of the infrared cut filter layer or the light shielding layer.

Here, the infrared cut filter layer or the light shielding layer is formed on the surface side opposite to the light receiving surface of the semiconductor substrate having the light sensing portion which photoelectrically converts incident light and on substantially the entire surface of the area corresponding to the area in which the light sensing portion of the semiconductor substrate is formed. Subsequently, the wiring layer is formed on the upper layer of the infrared cut filter layer or the light shielding layer. As a result, between the semiconductor substrate and the wiring layer, there is provided the infrared cut filter layer or the light shielding layer that is formed on the surface side opposite to the light receiving surface of the semiconductor substrate and is formed on substantially the entire surface of the area corresponding to the area in which the light sensing portion of the semiconductor substrate is formed. Hence, it is possible to suppress the color mixing caused by the light reflected by the wiring layer.

Furthermore, according to a further embodiment of the disclosure, a solid-state imaging apparatus includes: a solid-state imaging device that has a semiconductor substrate having a light sensing portion which photoelectrically converts incident light, an infrared cut filter layer or a light shielding layer which is provided on a surface side opposite to a light receiving surface of the semiconductor substrate and is formed on substantially the entire surface of an area corresponding to an area in which the light sensing portion of the semiconductor substrate is formed, and a wiring layer which is provided on an upper layer of the infrared cut filter layer or the light shielding layer; and an optical system that concentrates the incident light on the light sensing portion.

Further, according to a still further embodiment of the disclosure, an image capturing apparatus includes: a solid-state imaging device that has a semiconductor substrate having a light sensing portion which photoelectrically converts incident light, an infrared cut filter layer or a light shielding layer which is provided on a surface side opposite to a light receiving surface of the semiconductor substrate and is formed on substantially the entire surface of an area corresponding to an area in which the light sensing portion of the semiconductor substrate is formed, and a wiring layer which is provided on an upper layer of the infrared cut filter layer or the light shielding layer; an optical system that concentrates the incident light on the light sensing portion; and a signal processing section that processes signal charges which are photoelectrically converted by the light sensing portion.

Here, between the semiconductor substrate and the wiring layer, there is provided the infrared cut filter layer or the light shielding layer that is formed on the surface side opposite to the light receiving surface of the semiconductor substrate and is formed on substantially the entire surface of the area corresponding to the area in which the light sensing portion of the semiconductor substrate is formed. Thereby, it is possible to suppress the color mixing caused by the light reflected by the wiring layer.

In addition, it can be considered that the light reflected by the infrared cut filter layer or the light shielding layer is incident to the light sensing portion. However, since the infrared cut filter layer or the light shielding layer is provided closer to the semiconductor substrate than the wiring layer, it is considered that there is a low possibility that the reflected light is incident to the adjacent pixels.

In a solid-state imaging device, a solid-state imaging apparatus, and an image capturing apparatus using the solid-state imaging device and the manufacturing method according to the embodiment of the disclosure, it is possible to sufficiently suppress the color mixing caused by the light transmitted through the semiconductor substrate.

DETAILED DESCRIPTION OF EMBODIMENTS

Hereinafter, modes for carrying out the disclosure (hereinafter, referred to as "embodiments") will be described. In addition, description will be given in the order of the following items.

Figure 1:
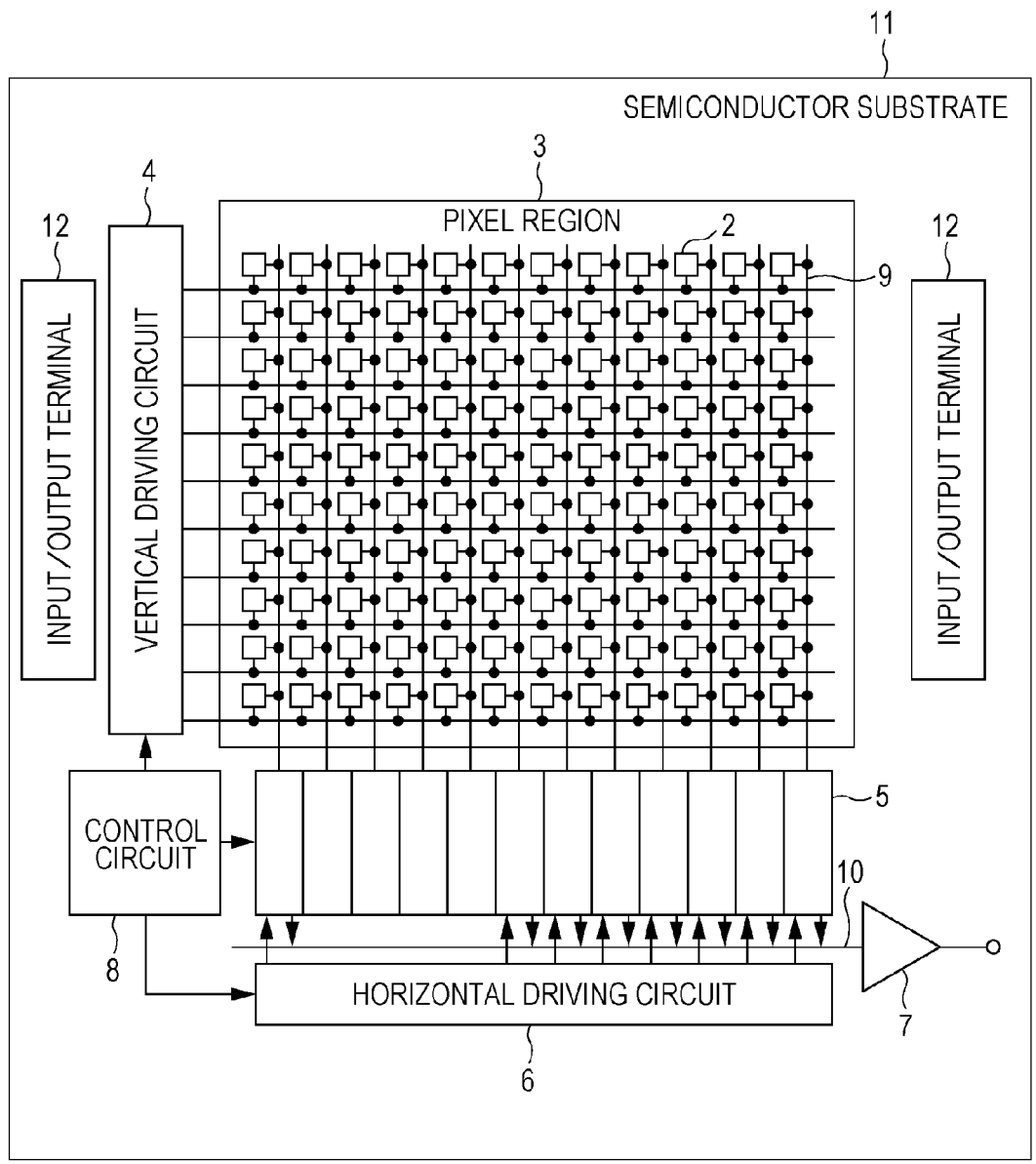
FIG. 1 is a diagram illustrating a schematic configuration of an example of a CMOS solid-state imaging apparatus according to each embodiment of the disclosure.

1. Schematic Configuration Example of CMOS Solid-State Imaging Apparatus
2. First Embodiment (Case (1) of Infrared Cut Filter Layer)
3. Second Embodiment (Case (2) of Infrared Cut Filter Layer)
4. Third Embodiment (Case of Light shielding Layer)
5. Fourth Embodiment (Case of Image Capturing Apparatus)
6. Modified Example 1. Schematic Configuration Example of CMOS Solid-State Imaging Apparatus FIG. 1 shows a schematic configuration of an example of a CMOS solid-state imaging apparatus according to each embodiment of the disclosure. As shown in FIG. 1, the solid-state imaging apparatus 1 according to the example includes a pixel region (a so-called imaging area) 3, in which pixels 2 including a plurality of photoelectric conversion elements in a semiconductor substrate 11 (for example, a silicon substrate) are regularly two-dimensionally arranged, and a peripheral circuit section.

The pixels 2 include for example photodiodes which are the photoelectric conversion elements, and a plurality of pixel transistors (so-called MOS transistors). A plurality of pixel transistors can be constituted by three transistors of, for example, a transfer transistor, a reset transistor, and an amplifier transistor. Besides, the transistors can be constituted by four transistors by adding a selection transistor.

Figure 17:
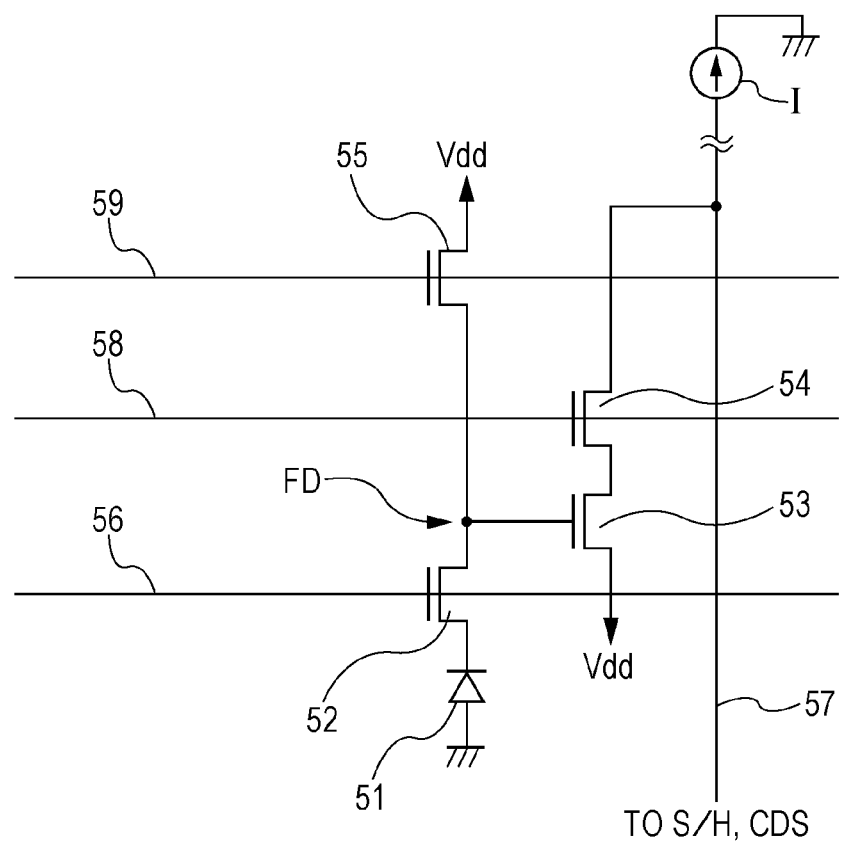
FIG. 17 is a schematic diagram illustrating an example of a circuit configuration of a unit pixel.
Figure 18:
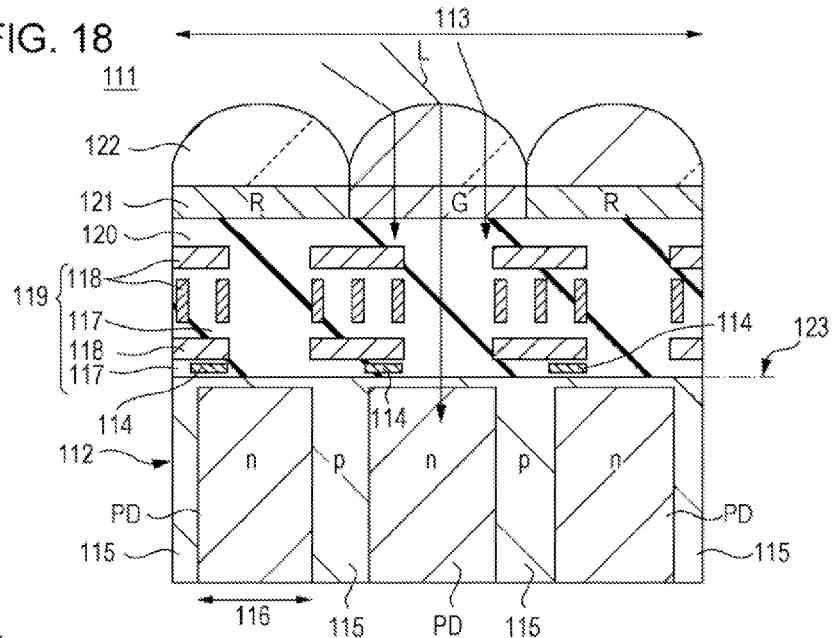
FIG. 18 is a schematic diagram illustrating a front-illuminated CMOS solid-state imaging apparatus in the related art.
Figure 19:
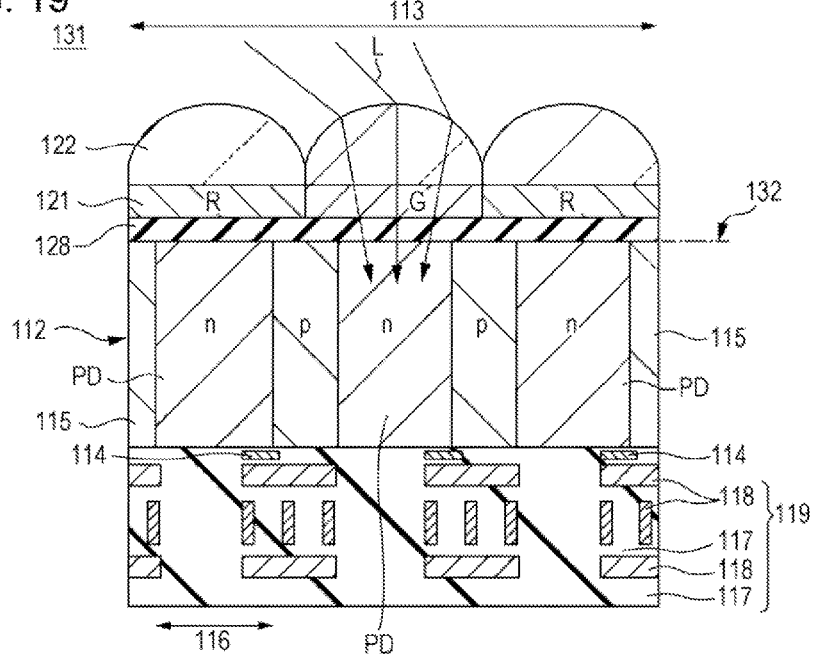
FIG. 19 is a schematic diagram (1) illustrating a front-illuminated CMOS solid-state imaging apparatus in the related art.
Figure 20:
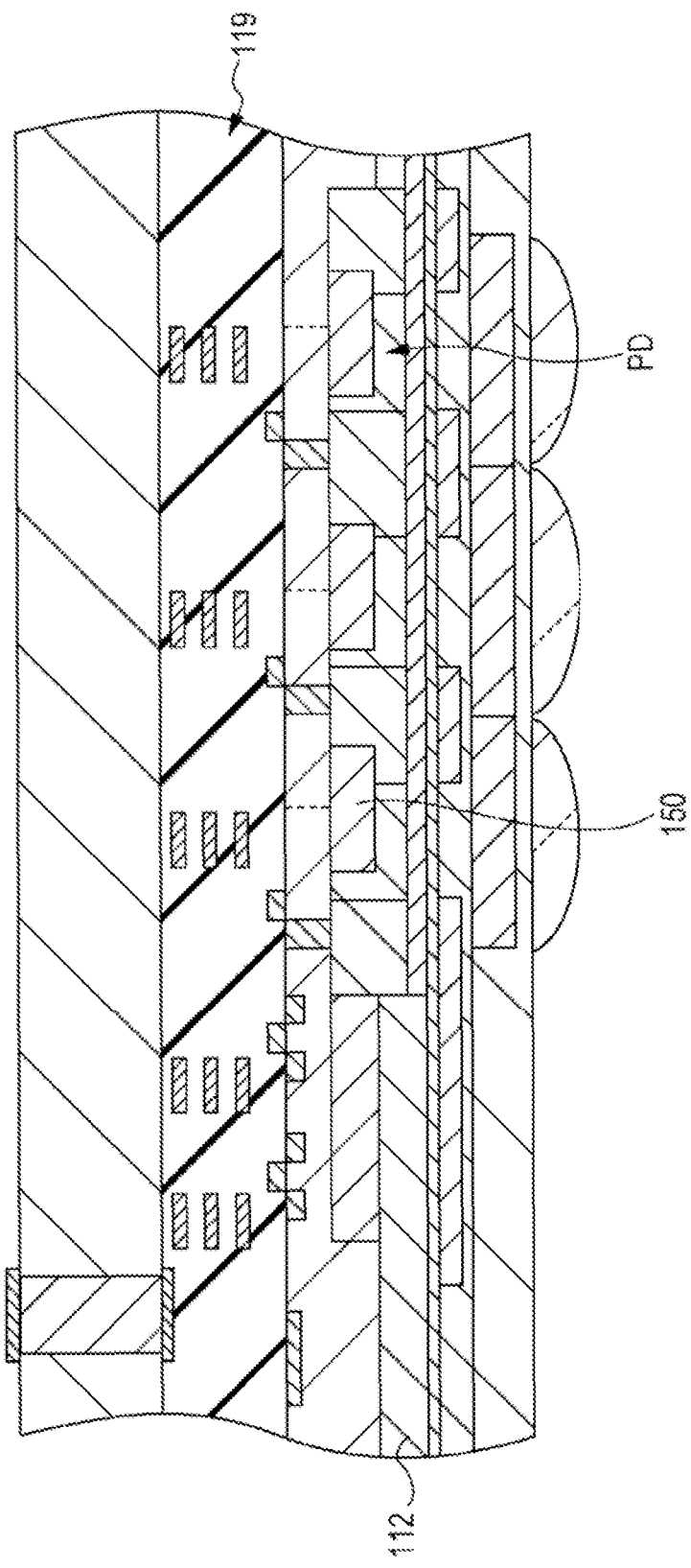
FIG. 20 is a schematic diagram (2) illustrating a front-illuminated CMOS solid-state imaging apparatus in the related art.

FIG. 17 is a schematic diagram illustrating an example of a circuit configuration of a unit pixel of the pixel 2.

The unit pixel has, for example, a photodiode 51 as the photoelectric conversion element, and has the following four transistors as active devices per single photodiode 51: a transfer transistor 52, an amplifier transistor 53, an address transistor 54, and a reset transistor 55.

The photodiode 51 photoelectrically converts incident light into electric charges (here electrons) of which the amount corresponds to the amount of the light. The transfer transistor 52 is connected between the photodiode 51 and the floating diffusion FD. The transfer transistor 52 transfers electrons, which are photoelectrically converted by the photodiode 51, to the floating diffusion FD when the gate (a transfer gate) of the transfer transistor receives a drive signal through the driving wire 56.

The floating diffusion FD is connected to the gate of the amplifier transistor 53. The amplifier transistor 53 is connected to a vertical signal line 57 through the address transistor 54. The amplifier transistor 53 and a constant current source I outside the pixel section constitute a source follower. In addition, through the driving wire 58, an address signal can be given to the gate of the address transistor 54. Thereby, when the address transistor 54 is turned on, the amplifier transistor 53 amplifies the electric potential of the floating diffusion FD, and outputs the voltage corresponding to the electric potential to the vertical signal line 57. Through the vertical signal line 57, the voltage, which is output from each pixel, is output to the S/H CDS circuit.

The reset transistor 55 is connected between a power source Vdd and a floating diffusion FD. The reset transistor 55 resets the electric potential of the floating diffusion FD to the electric potential of the power source Vdd when the gate thereof receives a reset signal through the driving wire 59.

The respective gates of the transfer transistor 52, the address transistor 54, and the reset transistor 55 are connected on a row-by-row basis. Accordingly, such an operation is simultaneously performed, in parallel, on each pixel corresponding to a single row.

Further, the pixels 2 may employ a shared pixel structure. This shared pixel structure is constituted by a plurality of photodiodes, a plurality of transfer transistors, a single floating diffusion being shared, and different pixel transistors being shared one by one.

The peripheral circuit section includes a vertical driving circuit 4, a column signal processing circuit 5, a horizontal driving circuit 6, an output circuit 7, and a control circuit 8.

The control circuit 8 receives data for giving instructions to an input clock, operation mode, and the like, and also outputs data such as internal information of the solid-state imaging apparatus. That is, the control circuit 8 generates a clock signal or a control signal which is a reference of the operation of the vertical driving circuit 4, the column signal processing circuit 5, the horizontal driving circuit 6, and the like on the basis of a vertical synchronization signal, a horizontal synchronization signal, and a master clock. Then, these signals are input to the vertical driving circuit 4, the column signal processing circuit 5, the horizontal driving circuit 6, and the like.

The vertical driving circuit 4 is constituted by, for example, a shift register, selects a pixel driving wire, supplies a pulse for driving the pixels to the selected pixel driving wire, and drives the pixels on a row-by-row basis. That is, the vertical driving circuit 4 selectively scans each pixel 2 of the pixel region 3 on a row-by-row basis in a sequential vertical direction, and supplies a pixel signal, which is based on a signal charge generated in response to the amount of light received by, for example, the photodiode used as a photoelectric conversion element of each pixel 2, to the column signal processing circuit 5 through a vertical signal line 9.

The column signal processing circuits 5 is disposed, for example, for each column of the pixel 2, and performs signal processing such as noise removal on a signal, which is output from the pixels 2 corresponding to a single row, for each pixel column. That is, the column signal processing circuit 5 performs signal processing such as CDS, signal amplification, or AD conversion for removing unique fixed pattern noise in the pixel 2. In an output stage of the column signal processing circuit 5, a horizontal selective switch (not shown in the drawings) is provided to be connected between a horizontal signal line 10 and the output stage.

The horizontal driving circuit 6 is constituted by, for example, shift registers, and sequentially outputs horizontal scan pulses, so that the horizontal driving circuit sequentially selects each of the column signal processing circuits 5, and then outputs pixel signals from each of the column signal processing circuits 5 to the horizontal signal line 10.

The output circuit 7 performs signal processing on signals which are sequentially supplied from each of the column signal processing circuits 5 through the horizontal signal line 10, and outputs the signals. For example, only buffering may be performed, or black level adjustment, column variation correction, various types of digital signal processing, and the like may be performed. An input/output terminal 12 interchanges signals with the outside.

2. First Embodiment

Configuration Example of Solid-State Imaging Apparatus

Figure 2:
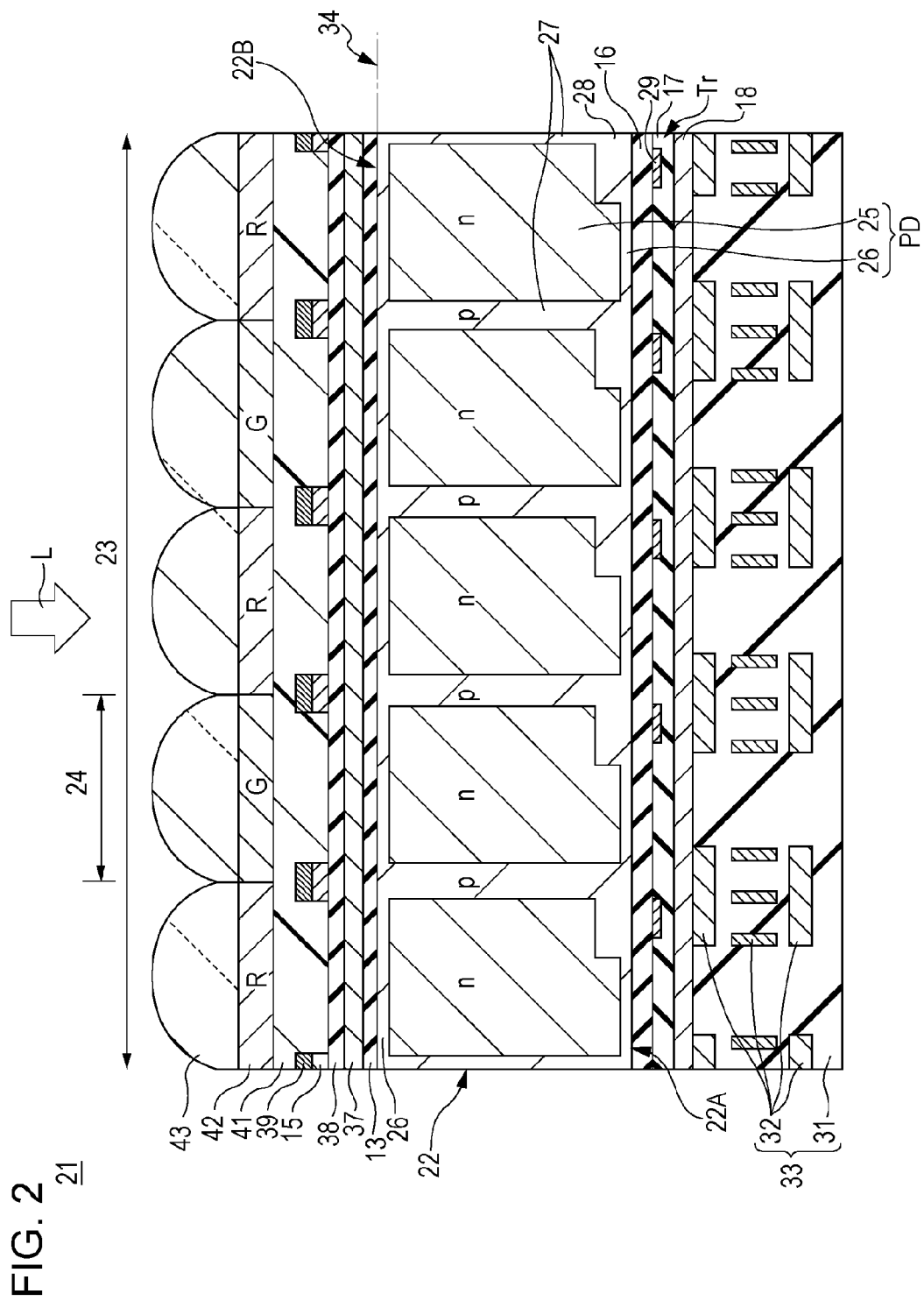
FIG. 2 is a schematic diagram illustrating a solid-state imaging apparatus according to a first embodiment of the disclosure.

FIG. 2 is a schematic diagram illustrating a solid-state imaging apparatus according to a first embodiment of the disclosure. The solid-state imaging apparatus according to the embodiment is a back-illuminated CMOS solid-state imaging apparatus. The solid-state imaging apparatus 21 according to the first embodiment has a configuration where, for example, a pixel region (so-called imaging area) 23, in which a plurality of pixels is arranged in a semiconductor substrate 22 made of silicon, and a peripheral circuit section, which is disposed in the periphery of the pixel region 23 although not shown in the drawing, are formed.

A unit pixel 24 is constituted by a photodiode PD used as a photoelectric conversion section and a plurality of pixel transistors Tr. The photodiode PD is formed over the entire area of the semiconductor substrate 22 in a thickness direction thereof, and is configured as a p-n junction type photodiode formed of an n-type semiconductor region 25 and a p-type semiconductor region 26 facing both sides of the substrate. The p-type semiconductor region facing both sides of the substrate further includes a hole charge accumulation region for suppressing dark currents.

Each pixel 24 formed of the photodiode PD and the pixel transistors Tr is isolated by an element isolation region 27 which is formed by the p-type semiconductor region. Although not shown in the drawings, the pixel transistor Tr is configured such that an n-type source region and a drain region thereof are formed in a p-type semiconductor well region 28 formed on a surface 22A side of the semiconductor substrate 22, and a gate electrode 29 thereof is formed on the substrate surface between both regions with a gate insulation film 16 interposed therebetween. In the same drawing, a plurality of pixel transistors is representatively shown by a single pixel transistor Tr, and is schematically indicated by the gate electrode 29.

An interlayer insulation film 17 is formed on the surface 22A of the semiconductor substrate 22, and an infrared cut filter layer 18 is formed on the upper layer of the interlayer insulation film 17 by alternately laminating $SiO_2$ (a refractive index of 1.46) and SiN (a refractive index of 2). In addition, the infrared cut filter layer 18 is formed on substantially the entire surface of the interlayer insulation film 17.

A so-called multilevel wiring layer 33, in which a plurality of wires 32 is disposed with an interlayer insulation film 31 interposed therebetween, is formed on the infrared cut filter layer 18. Since light is not incident to the multilevel wiring layer 33, it is possible for a layout of the wires 32 to be freely set up.

An interface oxide film 13 is formed on a substrate backside 22B used as a light receiving surface 34 of the photodiode PD. An antireflection film 37 made of SiON is formed on the interface oxide film 13. Moreover, an oxide film 38 made of $SiO_2$ is formed on the antireflection film 37.

Further, at a pixel boundary on the oxide film 38, that is, at a portion corresponding to the pixel boundary, a light shielding film 39 made of tungsten (W) is formed with a contact layer 15, which is made of Ti, interposed therebetween. In addition, the light shielding film 39 may be made of a material with a light shielding effect. However, it is preferable that the light shielding film 39 should be made of a material which is excellent in the light shielding effect and can be accurately processed by microfabrication such as etching.

A planarization film 41 is formed on the oxide film 38 including the contact layer 15 and the light shielding film 39, and an on-chip color filter 42 and an on-chip micro lens 43 are sequentially formed on the planarization film 41. The planarization film 41 can be made of, for example, organic materials such as resin. As an on-chip color filter 42, for example, a color filter formed in a Bayer array can be used. Further, the on-chip micro lens 43 is formed by, for example, organic materials such as resin.

In addition, the light L is incident from the substrate backside 22B, and is concentrated by the on-chip micro lens 43 and then received in each photodiode PD.

In the back-illuminated solid-state imaging apparatus 21 according to the first embodiment, the infrared cut filter layer 18 is formed over substantially the entire surface. Thus, even when the long-wavelength light such as infrared rays is incident from the backside of the substrate, it is possible to prevent the light from being incident to the multilevel wiring layer 33 side. Hence, the long-wavelength light, which is incident from the backside of the substrate, does not reach the multilevel wiring layer 33 side, and it is possible to suppress color mixing caused by the incidence of the light, which is reflected from the multilevel wiring layer 33, to the photodiode PD.

In addition, by forming the infrared cut filter layer 18, there is an increase in height from the photodiode PD to the upper layer of the multilevel wiring layer 33, but in the back-illuminated solid-state imaging apparatus, there is no concern about deterioration in the light concentration characteristic.

Modified Example

In the first embodiment, the infrared cut filter layer 18, which is formed by alternately laminating $SiO_2$ and SiN, was exemplified. However, it is not absolutely necessary for the infrared cut filter layer 18 to have a laminated structure of $SiO_2$ and SiN. Specifically, even when long-wavelength light such as infrared rays is incident from the backside of the substrate, if the layer is able to suppress the color mixing which is caused by the light reflected by the multilevel wiring layer, the layer is sufficient. Accordingly, it is not absolutely necessary to have a laminated structure of $SiO_2$ and SiN. For example, the infrared cut filter layer 18 may include titanium oxide, zirconium oxide, hafnium oxide, and tantalum oxide, or include at least one of the compounds. Further, the infrared cut filter layer 18 may include at least one of a phthalocyanine-based compound, an anthraquinone-based compound, a cyanine-based compound, a polymethylene-based compound, an aluminum-based compound, a diimmonium-based compound, an immonium-based compound, and an azo-based compound.

Example of Method of Manufacturing Solid-State Imaging Apparatus

FIGS. 3A, 3B, 4A, 4B, 5A, and 5B show a method of manufacturing the solid-state imaging apparatus 21 according to the first embodiment. Here, description will be given of a manufacturing method using an SOI substrate 47 which is formed of a silicon layer 44, a $SiO_2$ layer 45, and a silicon layer 46. In addition, reference numerals and signs of omitted parts refer to FIG. 2.

Figure 3A:
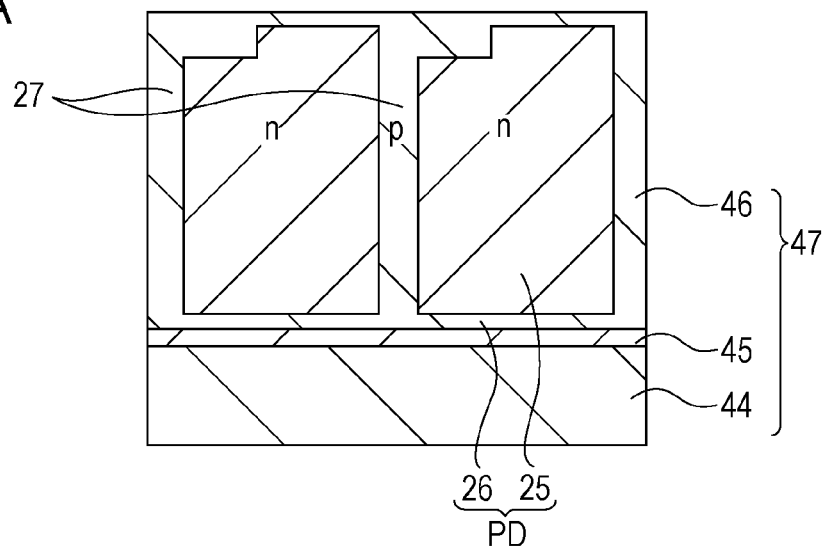
FIGS. 3A and 3B are schematic diagrams (1) illustrating a method of manufacturing the solid-state imaging apparatus according to the first embodiment.

In the method of manufacturing the solid-state imaging apparatus 21 according to the first embodiment, first, as shown in FIG. 3A, the photodiodes PD corresponding to each of the pixels, which are isolated by the element isolation region 27 formed by the p-type semiconductor region, are formed on an area in which the pixel region of the silicon layer 46 is to be formed.

In addition, the photodiodes PD are formed to include: p-n junctions formed of the n-type semiconductor regions 25 extending over the entire area of the substrate in the thickness direction thereof; and the p-type semiconductor region 26 facing both sides of the silicon layer 44 in contact with the n-type semiconductor region 25.

Next, the p-type semiconductor well regions 28, which are respectively in contact with the element isolation regions 27, are formed in areas corresponding to each pixel of the surface of the silicon layer 44, and a plurality of the pixel transistors Tr is formed within the p-type semiconductor well regions 28. The pixel transistors Tr are respectively formed of the source region and the drain region, the gate insulation film 16, and the gate electrode 29.

Subsequently, the interlayer insulation film 17 is formed by an oxide film or a nitride film, and the infrared cut filter layer 18 is formed on the upper layer of the interlayer insulation film 17 by alternately laminating $SiO_2$ and SiN.

Figure 3B:
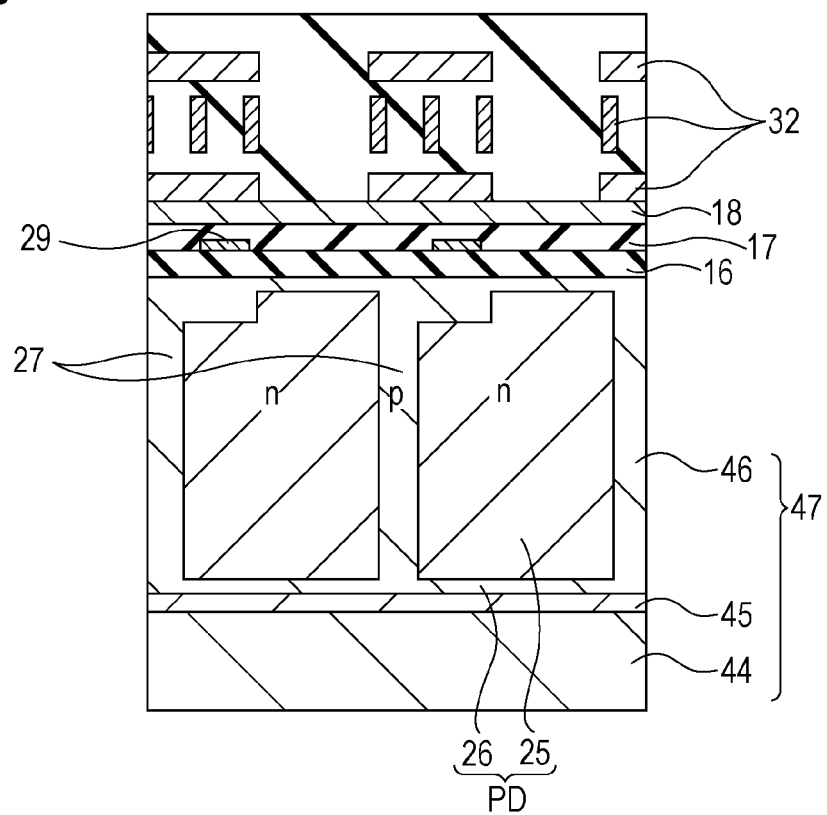

Further, the multilevel wiring layer 33, in which a plurality of wires 32 is disposed with the interlayer insulation film 31 interposed therebetween, is formed on the infrared cut filter layer 18 (refer to FIG. 3B).

Figure 4A:
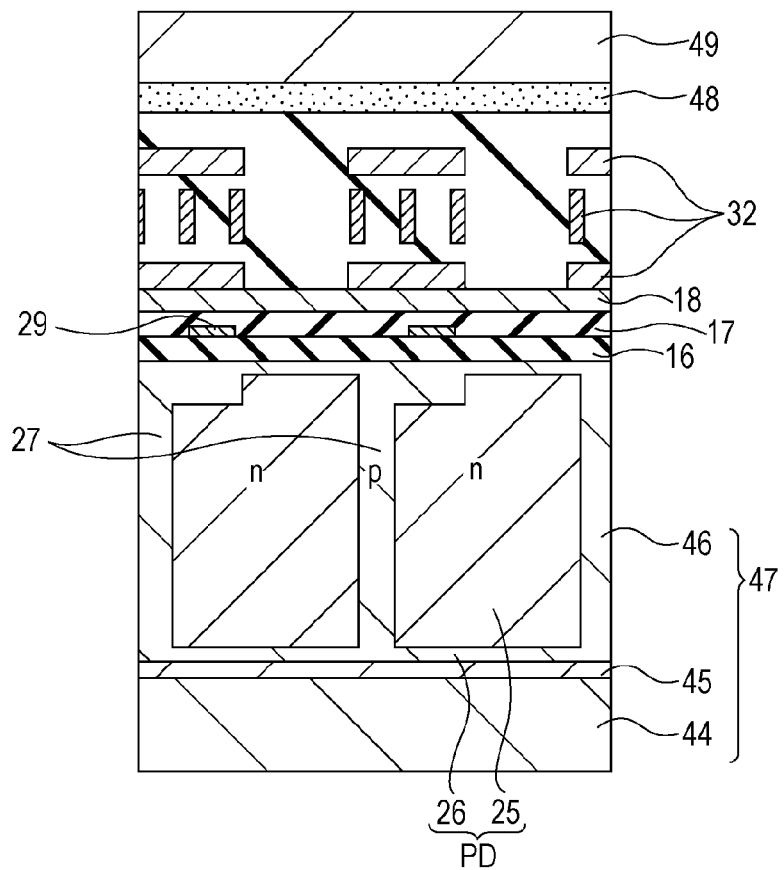
FIGS. 4A and 4B are schematic diagrams (2) illustrating the method of manufacturing the solid-state imaging apparatus according to the first embodiment.
Figure 4B:
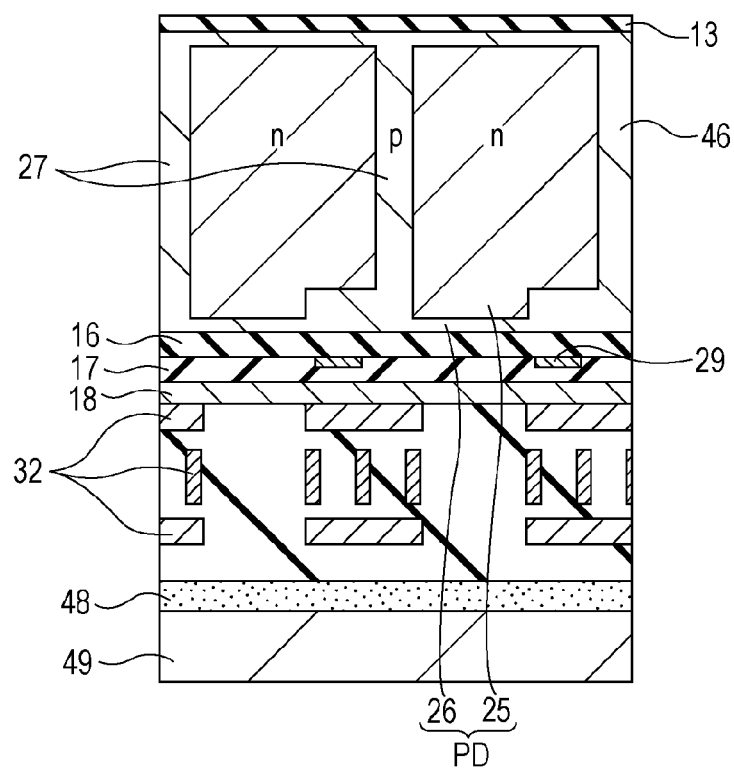

Next, as shown in FIG. 4A, a supporting substrate 49 is attached to the SOI substrate 47 with an adhesion layer 48 interposed therebetween. Subsequently, reversing the wafer, the silicon layer 44 and the $SiO_2$ layer 45 are removed by, for example, a back grinding method, a CMP method, a wet etching method, and the like, and thereby the back side of the silicon layer 46 is exposed (refer to FIG. 4B). In addition, a chemical oxide film (the interface oxide film 13) is formed on the back side of the silicon layer 46 by chemical processing.

Figure 5A:
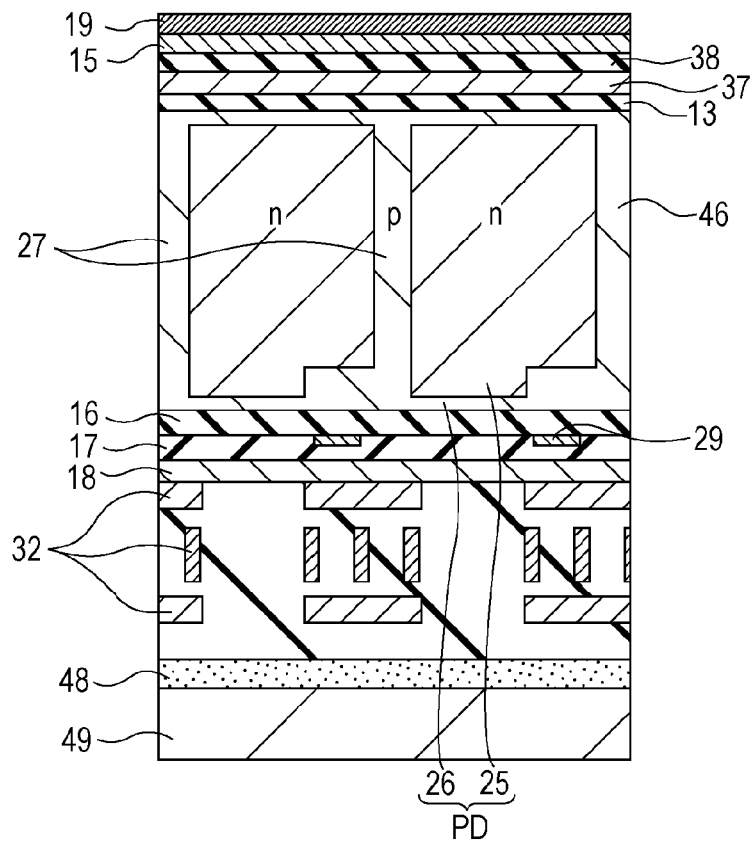
FIGS. 5A and 5B are schematic diagrams (3) illustrating the method of manufacturing the solid-state imaging apparatus according to the first embodiment.

Next, as shown in FIG. 5A, SiON as the antireflection film 37 is formed on the back side of the silicon layer 46 used as the light receiving surface by using the CVD method, $SiO_2$ as the oxide film 38 is formed by using the CVD method, and further a laminated film made of titanium/tungsten as the contact layer and the light shielding film 39 is formed. In addition, the tungsten and titanium serving as the contact layer 15 and the light shielding film 39 described herein is deposited in a general sputtering method, where the temperature of the film formation is in the range of room temperature to 400° C., the film thickness of titanium is in the range of about 5 nm to 50 nm, and the film thickness of tungsten is in the range of about 100 nm to 300 nm.

Here, the contact layer 15 may employ not only titanium but also titanium nitride (TiN). In this case, the layer can be deposited in a reactive sputtering method under the atmosphere in which nitrogen gas and argon gas are mixed at the time of PVD film formation.

Figure 5B:
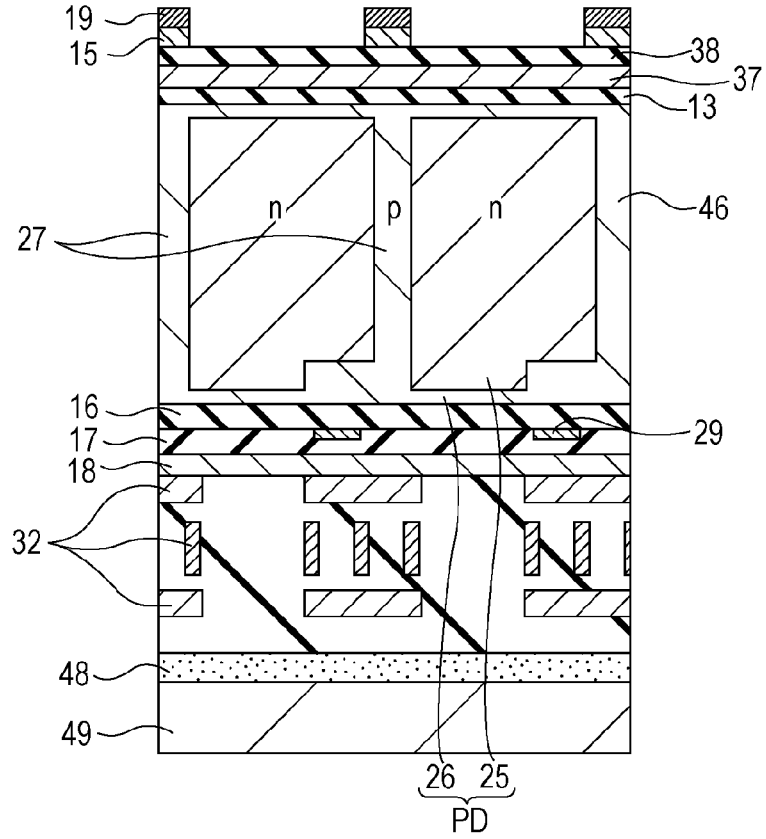

Subsequently, in order to form the opening portion for guiding visible light to the area corresponding to each photodiode PD, patterning is performed (refer to FIG. 5B). The patterning described herein is performed as follows: the contact layer 15 and the light shielding film 39 are selectively etched and removed through a resist mask (not shown in the drawings), thereby forming the contact layer 15 and the light shielding film 39 at each pixel boundary. In addition, the etching may use wet etching or dry etching. It is preferable to use dry etching since a fine line width of the light shielding film 39 is obtained with high accuracy.

Next, the planarization film 41 is formed on the oxide film 38 which includes the light shielding film 39. The planarization film 41 is formed by applying organic materials such as resin.

Then, the on-chip color filter 42 of, for example, the Bayer array and the on-chip micro lens 43 are sequentially formed on the planarization film 41. In such a manner, as shown in FIG. 2, the solid-state imaging apparatus 21 according to the first embodiment is obtained.

In the method of manufacturing the above-mentioned solid-state imaging apparatus 21 according to the first embodiment, there is no deterioration in device characteristics caused by silicon crystal defects.

Specifically, in the technique disclosed in Japanese Unexamined Patent Application Publication No. 2009-259934 mentioned above, after the infrared cut filter layer is formed, silicon is epitaxially grown, and then the floating diffusion region or the transistor are formed. For this reason, there is concern about deterioration in device characteristics caused by silicon defects.

Meanwhile, in the case of the method of manufacturing the back-illuminated solid-state imaging apparatus 21 according to the first embodiment, the floating diffusion region or the transistor are not formed after silicon is epitaxially grown, and thus there is no deterioration in device characteristics caused by silicon defects.

Further, in the technique disclosed in Japanese Unexamined Patent Application Publication No. 2009-259934, it is necessary for the infrared cut filter layer to have heat resistance which enables silicon to be epitaxially grown. Thus, materials available therefor are limited.

In contrast, in the case of the method of manufacturing the back-illuminated solid-state imaging apparatus 21 according to the first embodiment, materials of the infrared cut filter layer are not limited.

Furthermore, in the technique disclosed in Japanese Unexamined Patent Application Publication No. 2009-259934, it is necessary for the material of the infrared cut filter layer to have not only heat resistance but also affinity with epitaxial growth of silicon. For this reason, it is necessary to employ a complex process which has a large number of steps.

In contrast, in the case of the method of manufacturing the back-illuminated solid-state imaging apparatus 21 according to the first embodiment, the compatibility with the semiconductor process in the related art is good, it is possible to manufacture the apparatus while suppressing an increase in the number of steps, and it can be expected to improve fabrication yield.

3. Second Embodiment

Configuration Example of Solid-State Imaging Apparatus

Figure 6:
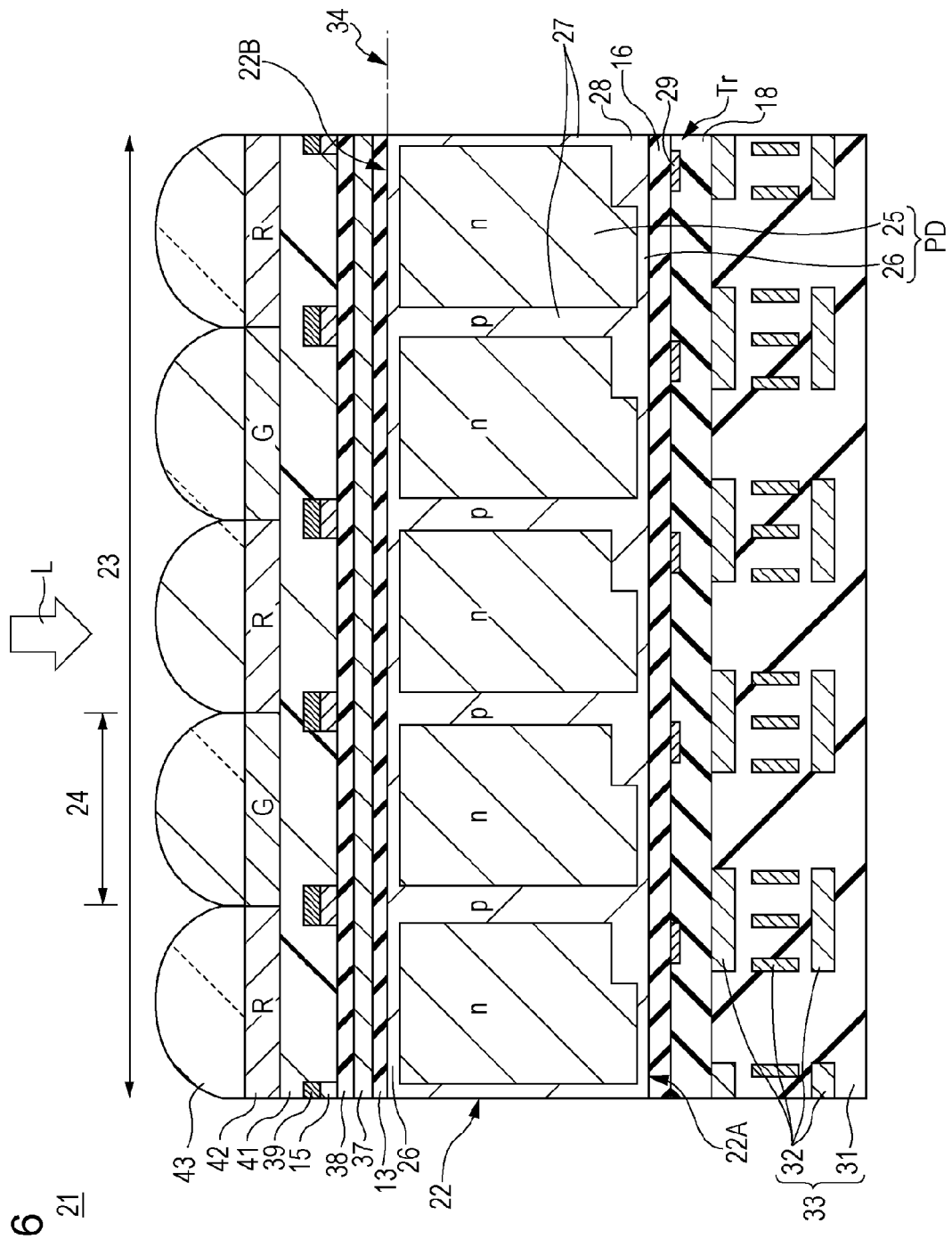
FIG. 6 is a schematic diagram illustrating a solid-state imaging apparatus according to a second embodiment of the disclosure.

FIG. 6 is a schematic diagram illustrating a solid-state imaging apparatus according to a second embodiment of the disclosure. The solid-state imaging apparatus according to the embodiment is a back-illuminated CMOS solid-state imaging apparatus. The solid-state imaging apparatus 21 according to the second embodiment has a configuration where, for example, a pixel region (so-called imaging area) 23, in which a plurality of pixels is arranged in a semiconductor substrate 22 made of silicon, and a peripheral circuit section, which is disposed in the periphery of the pixel region 23 although not shown in the drawing, are formed.

A unit pixel 24 is constituted by a photodiode PD used as a photoelectric conversion section and a plurality of pixel transistors Tr. The photodiode PD is formed over the entire area of the semiconductor substrate 22 in a thickness direction thereof, and is configured as a p-n junction type photodiode formed of an n-type semiconductor region 25 and a p-type semiconductor region 26 facing both sides of the substrate. The p-type semiconductor region facing both sides of the substrate further includes a hole charge accumulation region for suppressing dark currents.

Each pixel 24 formed of the photodiode PD and the pixel transistors Tr is isolated by an element isolation region 27 which is formed by the p-type semiconductor region. Although not shown in the drawings, the pixel transistor Tr is configured such that an n-type source region and a drain region thereof are formed in a p-type semiconductor well region 28 formed on a surface 22A side of the semiconductor substrate 22, and a gate electrode 29 thereof is formed on the substrate surface between both regions with a gate insulation film 16 interposed therebetween. In the same drawing, a plurality of pixel transistors is representatively shown by a single pixel transistor Tr, and is schematically indicated by the gate electrode 29.

An infrared cut filter layer 18, which is formed to include a phthalocyanine-based filter dye represented by Chemical Formula 1, is formed on the surface 22A of the semiconductor substrate 22. In addition, the infrared cut filter layer 18 is formed on substantially the entire surface of the gate insulation film 16.

Chemical Formula 1

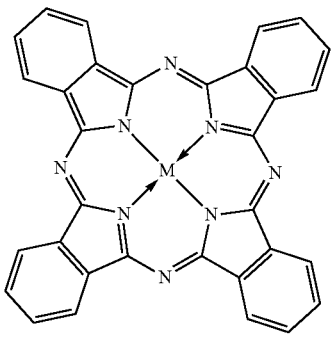

A so-called multilevel wiring layer 33, in which a plurality of wires 32 is disposed with an interlayer insulation film 31 interposed therebetween, is formed on the infrared cut filter layer 18. Since light is not incident to the multilevel wiring layer 33, it is possible for a layout of the wires 32 to be freely set up.

An interface oxide film 13 is formed on a substrate backside 22B used as a light receiving surface 34 of the photodiode PD. An antireflection film 37 made of SiON is formed on the interface oxide film 13. Moreover, an oxide film 38 made of $SiO_2$ is formed on the antireflection film 37.

Further, at a pixel boundary on the oxide film 38, that is, at a portion corresponding to the pixel boundary, a light shielding film 39 made of tungsten (W) is formed with a contact layer 15, which is made of Ti, interposed therebetween. In addition, the light shielding film 39 may be made of a material with a light shielding effect. However, it is preferable that the light shielding film 39 should be made of a material which is excellent in the light shielding effect and can be accurately processed by microfabrication such as etching.

A planarization film 41 is formed on the oxide film 38 including the contact layer 15 and the light shielding film 39, and an on-chip color filter 42 and an on-chip micro lens 43 are sequentially formed on the planarization film 41. The planarization film 41 can be made of, for example, organic materials such as resin. As an on-chip color filter 42, for example, a color filter formed in a Bayer array can be used. Further, the on-chip micro lens 43 is formed by, for example, organic materials such as resin.

In addition, the light L is incident from the substrate backside 22B, and is concentrated by the on-chip micro lens 43 and then received in each photodiode PD.

In the back-illuminated solid-state imaging apparatus 21 according to the second embodiment, the infrared cut filter layer 18 is formed over substantially the entire surface. Thus, even when the long-wavelength light such as infrared rays is incident from the backside of the substrate, it is possible to prevent the light from being incident to the multilevel wiring layer 33 side. Hence, the long-wavelength light, which is incident from the backside of the substrate, does not reach the multilevel wiring layer 33 side, and it is possible to suppress color mixing caused by the incidence of the light, which is reflected from the multilevel wiring layer 33, to the photodiode PD.

In addition, in the back-illuminated solid-state imaging apparatus 21 according to the second embodiment, the interlayer insulation film 17, which is formed in the above-mentioned back-illuminated solid-state imaging apparatus according to the first embodiment, is not formed, and thus the thickness substantially equal to that of the back-illuminated solid-state imaging apparatus in the related art is achieved. That is, it is possible to suppress color mixing while maintaining the thickness substantially equal to that of the back-illuminated solid-state imaging apparatus in the related art.

Further, the infrared cut filter layer 18, which is formed to include the phthalocyanine-based filter dye, has a function of absorbing infrared rays. Hence, it is possible to suppress the reflection due to the infrared cut filter layer 18, and thus it is also possible to more sufficiently suppress color mixing.

Modified Example

In the second embodiment, the infrared cut filter layer 18, which is formed to include the phthalocyanine-based filter dye, was exemplified. However, it is not indispensable for the infrared cut filter layer 18 to include the phthalocyanine-based filter dye. Specifically, even when long-wavelength light such as infrared rays is incident from the backside of the substrate, if the layer is able to suppress the color mixing which is caused by the light reflected by the multilevel wiring layer, the layer is available. Accordingly, it is not indispensable to include the phthalocyanine-based filter dye. For example, the infrared cut filter layer 18 may include at least one of an anthraquinone-based compound, a cyanine-based compound, a polymethylene-based compound, an aluminum-based compound, a diimmonium-based compound, an immonium-based compound, and an azo-based compound. Further, the infrared cut filter layer 18 may include silicon oxide, silicon nitride, titanium oxide, zirconium oxide, hafnium oxide, and tantalum oxide, or include at least one of the compounds.

Example of Method of Manufacturing Solid-State Imaging Apparatus

FIGS. 7A, 7B, 8A, 8B, 9A, and 9B show a method of manufacturing the solid-state imaging apparatus 21 according to the second embodiment. Here, description will be given of a manufacturing method using an SOI substrate 47 which is formed of a silicon layer 44, a SiO$_2$ layer 45, and a silicon layer 46. In addition, reference numerals and signs of omitted parts refer to FIG. 6.

Figure 7A:
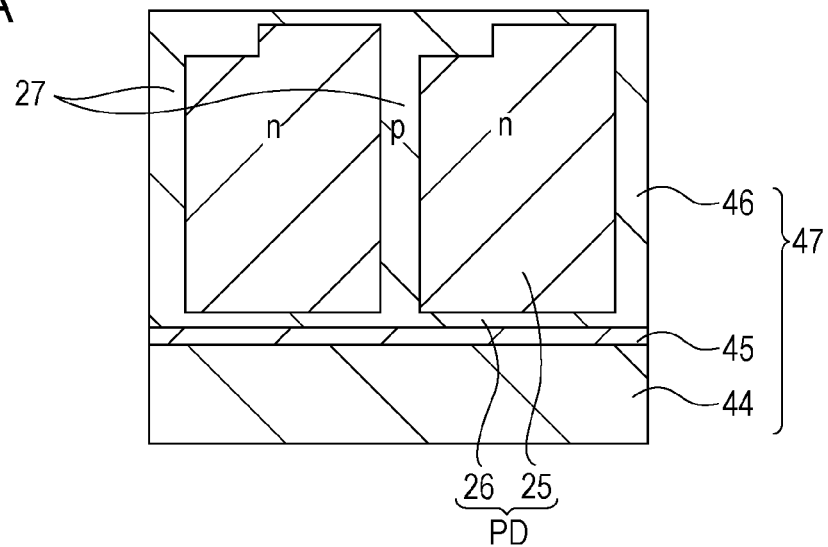
FIGS. 7A and 7B are schematic diagrams (1) illustrating a method of manufacturing the solid-state imaging apparatus according to the second embodiment.

In the method of manufacturing the solid-state imaging apparatus 21 according to the second embodiment, first, as shown in FIG. 7A, the photodiodes PD corresponding to each of the pixels, which are isolated by the element isolation region 27 formed by the p-type semiconductor region, are formed on an area in which the pixel region of the silicon layer 46 is to be formed.

In addition, the photodiodes PD are formed to include: p-n junctions formed of the n-type semiconductor regions 25 extending over the entire area of the substrate in the thickness direction thereof; and the p-type semiconductor region 26 facing both sides of the silicon layer 44 in contact with the n-type semiconductor region 25.

Next, the p-type semiconductor well regions 28, which are respectively in contact with the element isolation regions 27, are formed in areas corresponding to each pixel of the surface of the silicon layer 44, and a plurality of the pixel transistors Tr is formed within the p-type semiconductor well regions 28. The pixel transistors Tr are respectively formed of the source region and the drain region, the gate insulation film 16, and the gate electrode 29.

Subsequently, the infrared cut filter layer 18, which includes the phthalocyanine-based filter dye, is formed on the upper layer of the gate insulation film 16 so as to cover the gate electrode 29.

Figure 7B:
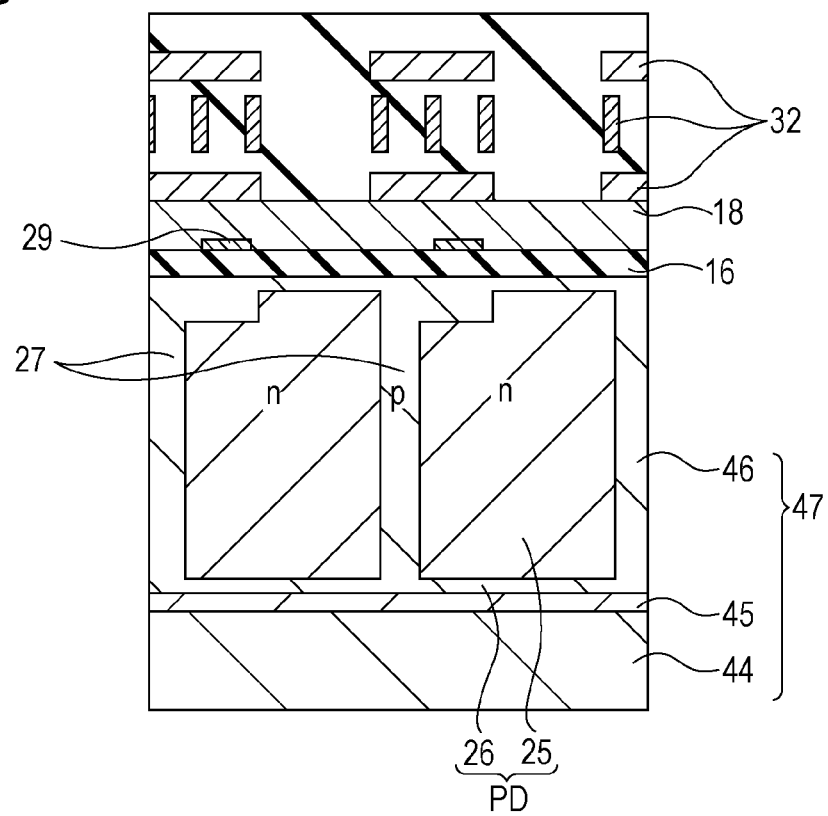

Further, the multilevel wiring layer 33, in which a plurality of wires 32 is disposed with the interlayer insulation film 31 interposed therebetween, is formed on the infrared cut filter layer 18 (refer to FIG. 7B).

Figure 8A:
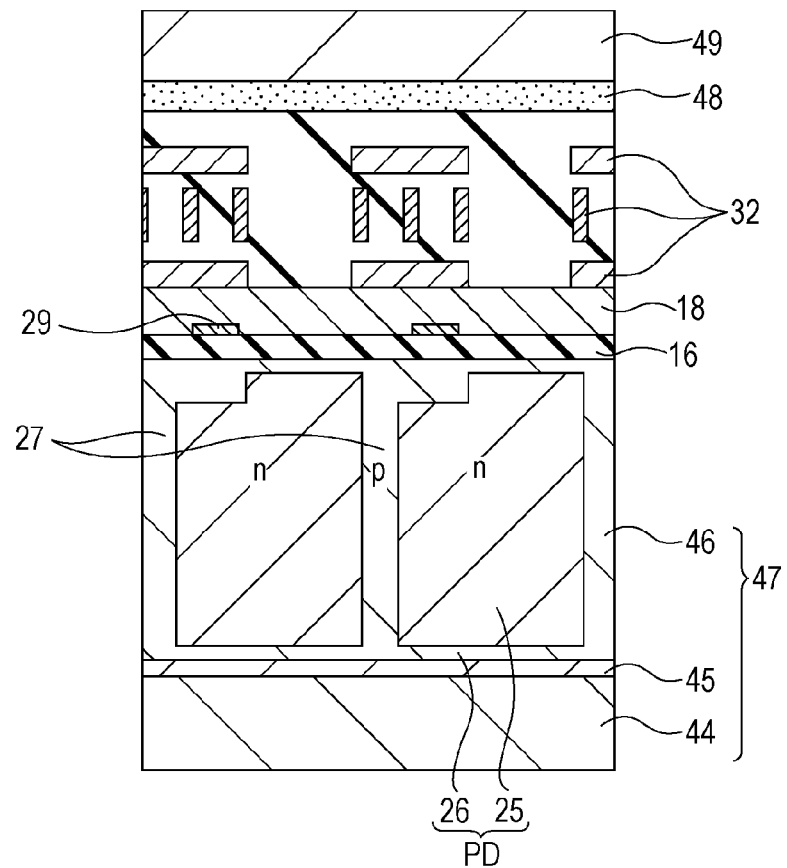
FIGS. 8A and 8B are schematic diagrams (2) illustrating the method of manufacturing the solid-state imaging apparatus according to the second embodiment.
Figure 8B:
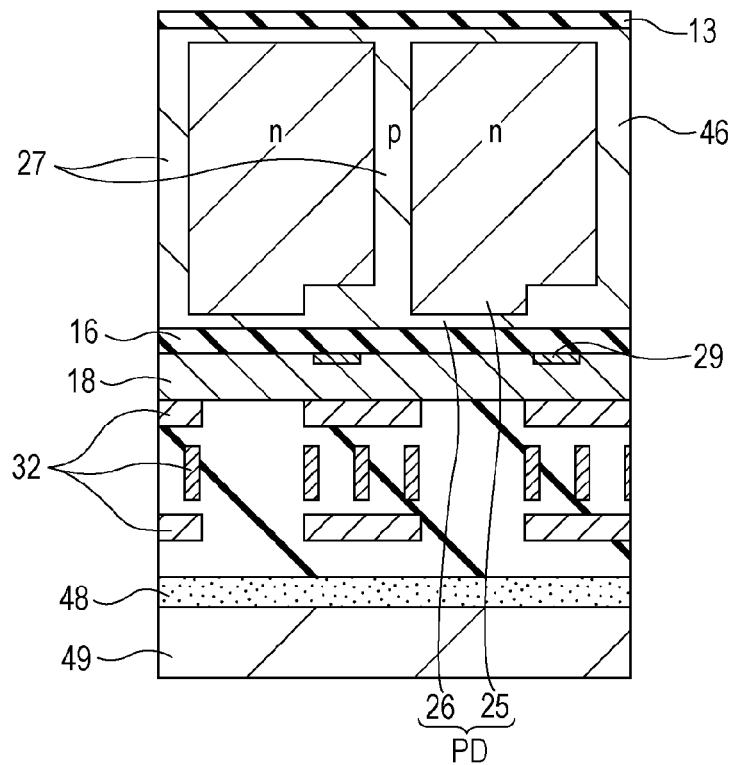

Next, as shown in FIG. 8A, a supporting substrate 49 is attached to the SOI substrate 47 with an adhesion layer 48 interposed therebetween. Subsequently, reversing the wafer, the silicon layer 44 and the SiO$_2$ layer 45 are removed by, for example, a back grinding method, a CMP method, a wet etching method, and the like, and thereby the back side of the silicon layer 46 is exposed (refer to FIG. 8B). In addition, a chemical oxide film (the interface oxide film 13) is formed on the back side of the silicon layer 46 by chemical processing.

Figure 9A:
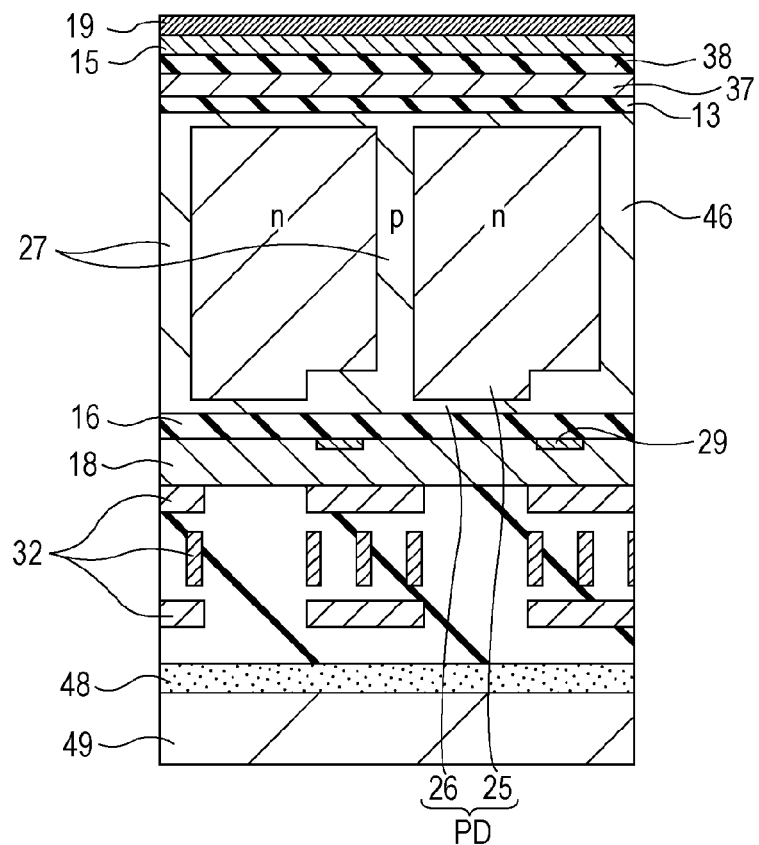
FIGS. 9A and 9B are schematic diagrams (3) illustrating the method of manufacturing the solid-state imaging apparatus according to the second embodiment.

Next, as shown in FIG. 9A, SiON as the antireflection film 37 is formed on the back side of the silicon layer 46 used as the light receiving surface by using the CVD method, SiO$_2$ as the oxide film 38 is formed by using the CVD method, and further a laminated film made of titanium/tungsten as the contact layer and the light shielding film 39 is formed. In addition, the tungsten and titanium serving as the contact layer 15 and the light shielding film 39 described herein is deposited in a general sputtering method, where the temperature of the film formation is in the range of room temperature to 400° C., the film thickness of titanium is in the range of about 5 nm to 50 nm, and the film thickness of tungsten is in the range of about 100 nm to 300 nm.

Here, the contact layer 15 may employ not only titanium but also titanium nitride (TiN). In this case, the layer can be deposited in a reactive sputtering method under the atmosphere in which nitrogen gas and argon gas are mixed at the time of PVD film formation.

Figure 9B:
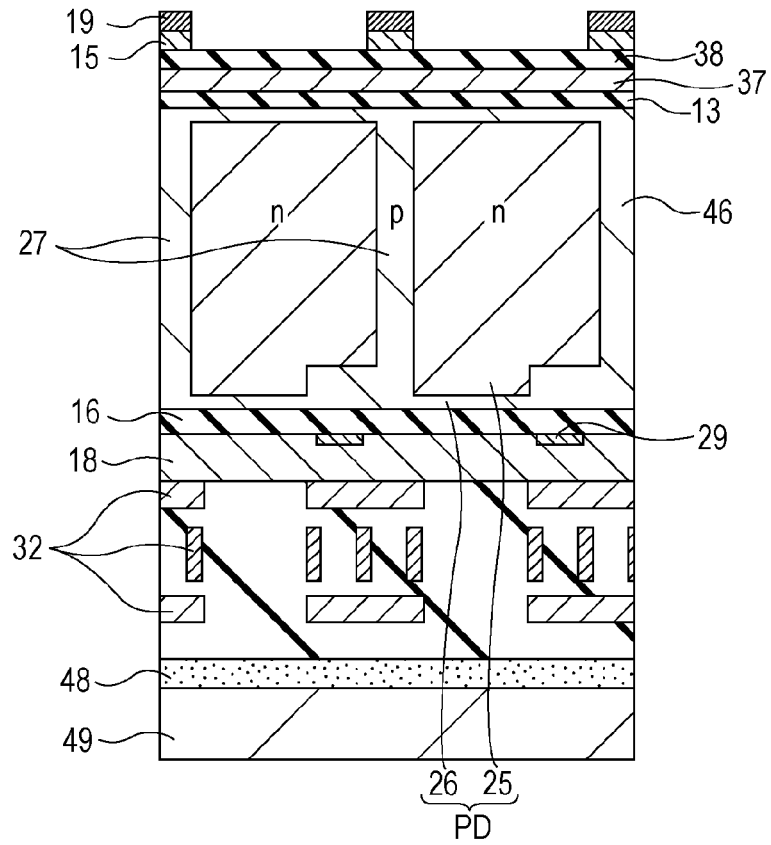

Subsequently, in order to form the opening portion for guiding visible light to the area corresponding to each photodiode PD, patterning is performed (refer to FIG. 9B). The patterning described herein is performed as follows: the contact layer 15 and the light shielding film 39 are selectively etched and removed through a resist mask (not shown in the drawings), thereby forming the contact layer 15 and the light shielding film 39 at each pixel boundary. In addition, the etching may use wet etching or dry etching. It is preferable to use dry etching since a fine line width of the light shielding film 39 is obtained with high accuracy.

Next, the planarization film 41 is formed on the oxide film 38 which includes the light shielding film 39. The planarization film 41 is formed by applying organic materials such as resin.

Then, the on-chip color filter 42 of, for example, the Bayer array and the on-chip micro lens 43 are sequentially formed on the planarization film 41. In such a manner, as shown in FIG. 6, the solid-state imaging apparatus 21 according to the second embodiment is obtained.

In the method of manufacturing the above-mentioned solid-state imaging apparatus 21 according to the second embodiment, similarly to the method of manufacturing the solid-state imaging apparatus according to the first embodiment, there is no deterioration in device characteristics caused by silicon crystal defects.

Further, this embodiment is similar to the first embodiment in the following respects: materials of the infrared cut filter layer are not limited; the compatibility with the semiconductor process in the related art is good; it is possible to manufacture the apparatus while suppressing an increase in the number of steps; and it can be expected to improve fabrication yield.

4. Third Embodiment

Configuration Example of Solid-State Imaging Apparatus

Figure 10:
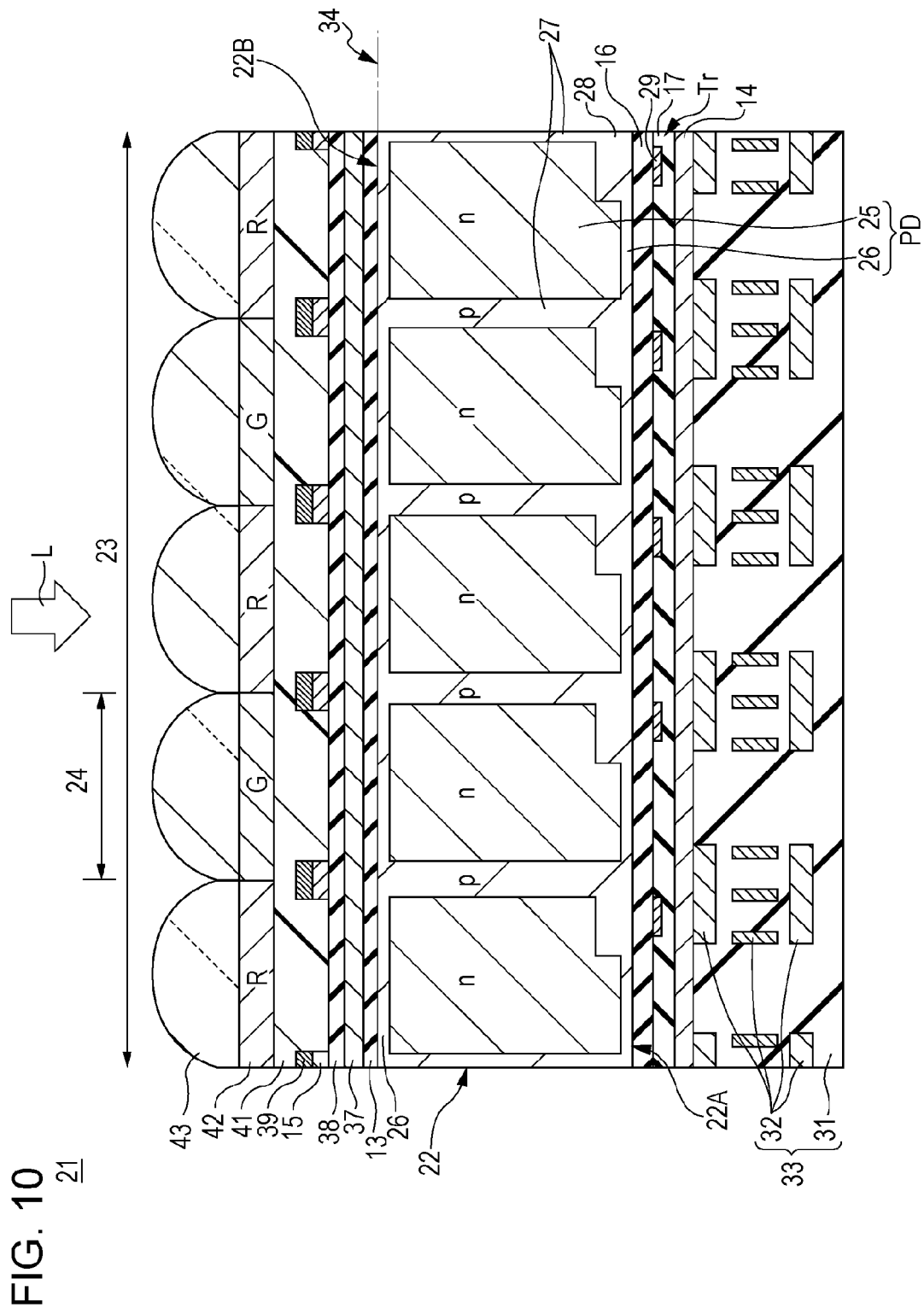
FIG. 10 is a schematic diagram illustrating a solid-state imaging apparatus according to a third embodiment of the disclosure.

FIG. 10 is a schematic diagram illustrating a solid-state imaging apparatus according to a third embodiment of the disclosure. The solid-state imaging apparatus according to the embodiment is a back-illuminated CMOS solid-state imaging apparatus. The solid-state imaging apparatus 21 according to the third embodiment has a configuration where, for example, a pixel region (so-called imaging area) 23, in which a plurality of pixels is arranged in a semiconductor substrate 22 made of silicon, and a peripheral circuit section, which is disposed in the periphery of the pixel region 23 although not shown in the drawing, are formed.

A unit pixel 24 is constituted by a photodiode PD used as a photoelectric conversion section and a plurality of pixel transistors Tr. The photodiode PD is formed over the entire area of the semiconductor substrate 22 in a thickness direction thereof, and is configured as a p-n junction type photodiode formed of an n-type semiconductor region 25 and a p-type semiconductor region 26 facing both sides of the substrate. The p-type semiconductor region facing both sides of the substrate further includes a hole charge accumulation region for suppressing dark currents.

Each pixel 24 formed of the photodiode PD and the pixel transistors Tr is isolated by an element isolation region 27 which is formed by the p-type semiconductor region. Although not shown in the drawings, the pixel transistor Tr is configured such that an n-type source region and a drain region thereof are formed in a p-type semiconductor well region 28 formed on a surface 22A side of the semiconductor substrate 22, and a gate electrode 29 thereof is formed on the substrate surface between both regions with a gate insulation film 16 interposed therebetween. In the same drawing, a plurality of pixel transistors is representatively shown by a single pixel transistor Tr, and is schematically indicated by the gate electrode 29.

An interlayer insulation film 17 is formed on the surface 22A of the semiconductor substrate 22, and a light shielding film 14 made of aluminum is formed on the upper layer of the interlayer insulation film 17. In addition, the light shielding film 14 is formed on substantially the entire surface of the interlayer insulation film 17.

A so-called multilevel wiring layer 33, in which a plurality of wires 32 is disposed with an interlayer insulation film 31 interposed therebetween, is formed on the light shielding film 14. Since light is not incident to the multilevel wiring layer 33, it is possible for a layout of the wires 32 to be freely set up.

An interface oxide film 13 is formed on a substrate backside 22B used as a light receiving surface 34 of the photodiode PD. An antireflection film 37 made of SiON is formed on the interface oxide film 13. Moreover, an oxide film 38 made of $SiO_2$ is formed on the antireflection film 37.

Further, at a pixel boundary on the oxide film 38, that is, at a portion corresponding to the pixel boundary, a light shielding film 39 made of tungsten (W) is formed with a contact layer 15, which is made of Ti, interposed therebetween. In addition, the light shielding film 39 may be made of a material with a light shielding effect. However, it is preferable that the light shielding film 39 should be made of a material which is excellent in the light shielding effect and can be accurately processed by microfabrication such as etching.

A planarization film 41 is formed on the oxide film 38 including the contact layer 15 and the light shielding film 39, and an on-chip color filter 42 and an on-chip micro lens 43 are sequentially formed on the planarization film 41. The planarization film 41 can be made of, for example, organic materials such as resin. As an on-chip color filter 42, for example, a color filter formed in a Bayer array can be used. Further, the on-chip micro lens 43 is formed by, for example, organic materials such as resin.

In addition, the light L is incident from the substrate backside 22B, and is concentrated by the on-chip micro lens 43 and then received in each photodiode PD.

In the back-illuminated solid-state imaging apparatus 21 according to the third embodiment, the light shielding film 14 is formed over substantially the entire surface. Thus, even when the long-wavelength light such as infrared rays is incident from the backside of the substrate, it is possible to prevent the light from being incident to the multilevel wiring layer 33 side. Hence, the long-wavelength light, which is incident from the backside of the substrate, does not reach the multilevel wiring layer 33 side, and it is possible to suppress color mixing caused by the incidence of the light, which is reflected from the multilevel wiring layer 33, to the photodiode PD.

In addition, by forming the light shielding film 14, there is an increase in height from the photodiode PD to the upper layer of the multilevel wiring layer 33, but in the back-illuminated solid-state imaging apparatus, there is no concern about deterioration in light concentration characteristic.

Modified Example

In the third embodiment, the light shielding film 14, which is made of aluminum, was exemplified. However, it is not absolutely necessary for the light shielding film 14 to be made of aluminum. Specifically, even when long-wavelength light such as infrared rays is incident from the backside of the substrate, if the layer is able to suppress the color mixing which is caused by the light reflected by the multilevel wiring layer, the layer is available. Accordingly, it is not absolutely necessary to employ the light shielding film made of aluminum. For example, metal materials other than aluminum may be employed, and nonmetal materials may be employed so far as the materials have a light shielding effect.

Example of Method of Manufacturing Solid-State Imaging Apparatus

FIGS. 11A, 11B, 12A, 12B, 13A, and 13B show a method of manufacturing the solid-state imaging apparatus 21 according to the third embodiment. Here, description will be given of a manufacturing method using an SOI substrate 47 which is formed of a silicon layer 44, a $SiO_2$ layer 45, and a silicon layer 46. In addition, reference numerals and signs of omitted parts refer to FIG. 10.

Figure 11A:
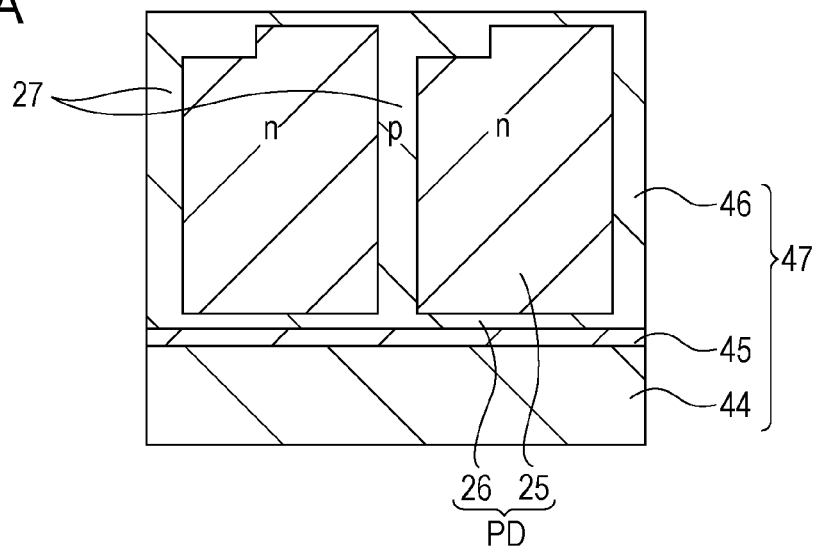
FIGS. 11A and 11B are schematic diagrams (1) illustrating a method of manufacturing the solid-state imaging apparatus according to the third embodiment.

In the method of manufacturing the solid-state imaging apparatus 21 according to the third embodiment, first, as shown in FIG. 11A, the photodiodes PD corresponding to each of the pixels, which are isolated by the element isolation region 27 formed by the p-type semiconductor region, are formed on an area in which the pixel region of the silicon layer 46 is to be formed.

In addition, the photodiodes PD are formed to include: p-n junctions formed of the n-type semiconductor regions 25 extending over the entire area of the substrate in the thickness direction thereof; and the p-type semiconductor region 26 facing both sides of the silicon layer 44 in contact with the n-type semiconductor region 25.

The p-type semiconductor well regions 28, which are respectively in contact with the element isolation regions 27, are formed in areas corresponding to each pixel of the surface of the silicon layer 44, and a plurality of the pixel transistors Tr is formed within the p-type semiconductor well regions 28. The pixel transistors Tr are respectively formed of the source region and the drain region, the gate insulation film 16, and the gate electrode 29.

Subsequently, the interlayer insulation film 17 is formed by an oxide film or a nitride film, and the light shielding film 14 made of aluminum is formed on the upper layer of the interlayer insulation film 17.

Figure 11B:
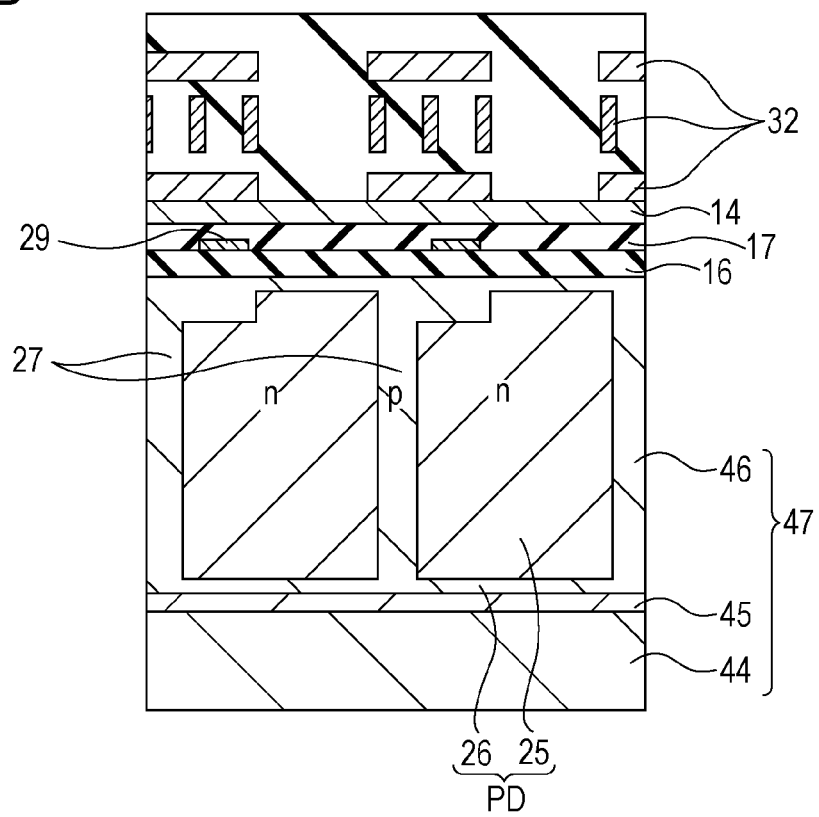

Further, the multilevel wiring layer 33, in which a plurality of wires 32 is disposed with the interlayer insulation film 31 interposed therebetween, is formed on the light shielding layer 14 (refer to FIG. 11B).

Figure 12A:
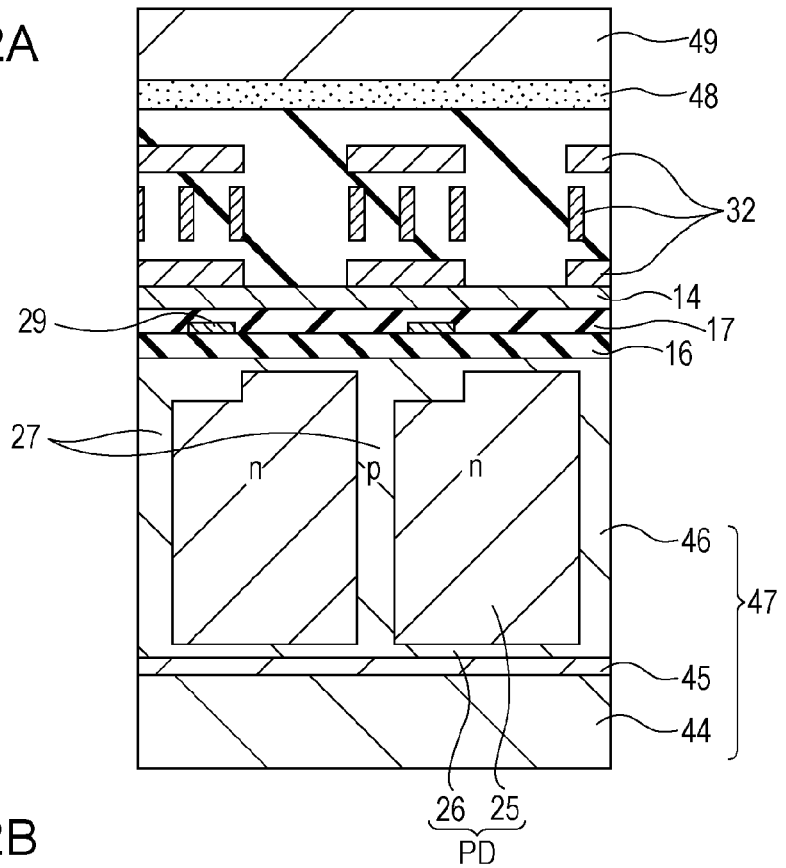
FIGS. 12A and 12B are schematic diagrams (2) illustrating the method of manufacturing the solid-state imaging apparatus according to the third embodiment.
Figure 12B:
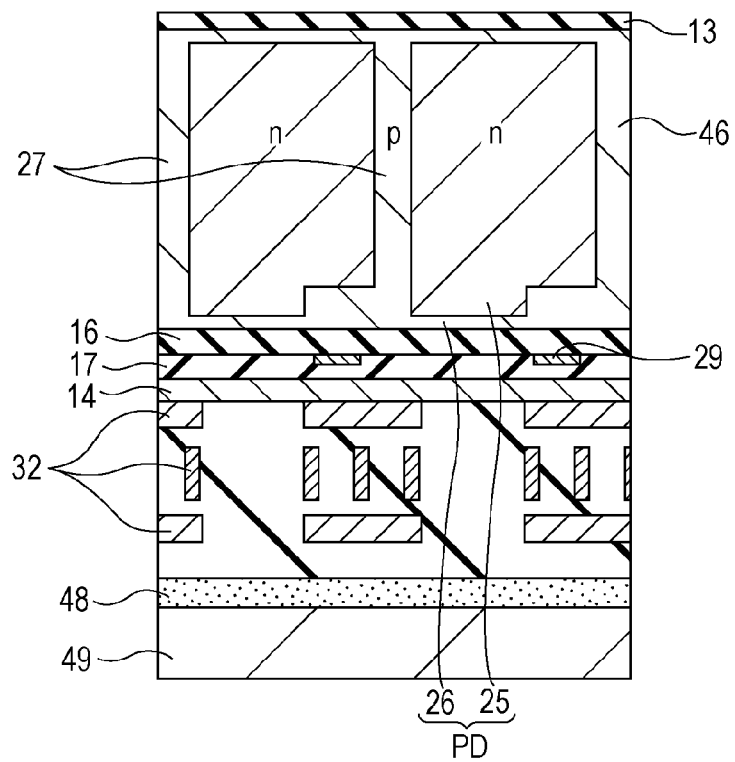

Next, as shown in FIG. 12A, a supporting substrate 49 is attached to the SOI substrate 47 with an adhesion layer 48 interposed therebetween. Subsequently, reversing the wafer, the silicon layer 44 and the $SiO_2$ layer 45 are removed by, for example, a back grinding method, a CMP method, a wet etching method, and the like, and thereby the back side of the silicon layer 46 is exposed (refer to FIG. 12B). In addition, a chemical oxide film (the interface oxide film 13) is formed on the back side of the silicon layer 46 by chemical processing.

Figure 13A:
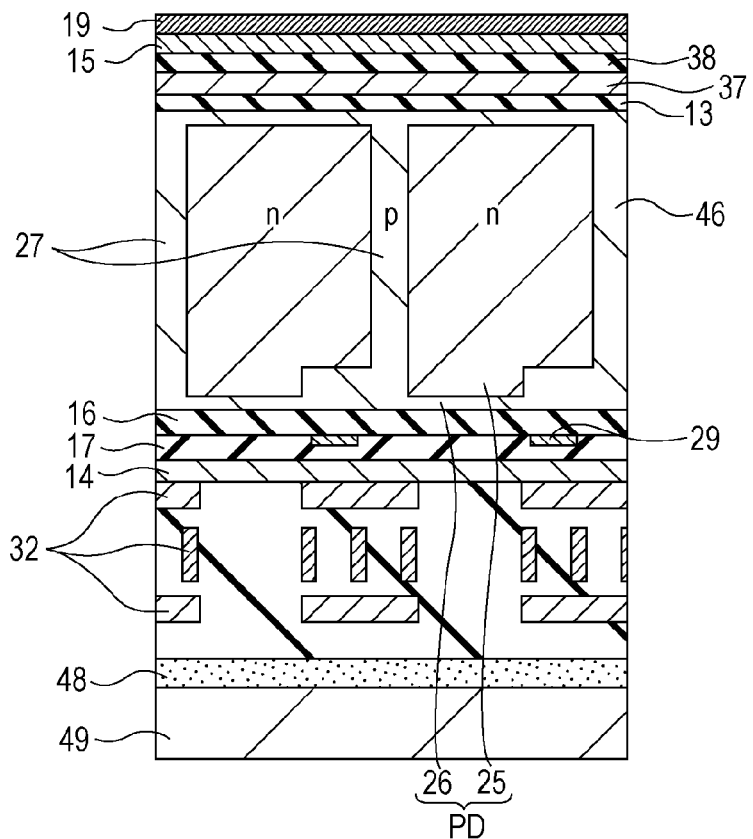
FIGS. 13A and 13B are schematic diagrams (3) illustrating the method of manufacturing the solid-state imaging apparatus according to the third embodiment.

Next, as shown in FIG. 13A, SiON as the antireflection film 37 is formed on the back side of the silicon layer 46 used as the light receiving surface by using the CVD method, $SiO_2$ as the oxide film 38 is formed by using the CVD method, and further a laminated film made of titanium/tungsten as the contact layer and the light shielding film 39 is formed. In addition, the tungsten and titanium serving as the contact layer 15 and the light shielding film 39 described herein are deposited in a general sputtering method, where the temperature of the film formation is in the range of room temperature to 400° C., the film thickness of titanium is in the range of about 5 nm to 50 nm, and the film thickness of tungsten is in the range of about 100 nm to 300 nm.

Here, the contact layer 15 may employ not only titanium but also titanium nitride (TiN). In this case, the layer can be deposited in a reactive sputtering method under the atmosphere in which nitrogen gas and argon gas are mixed at the time of PVD film formation.

Figure 13B:
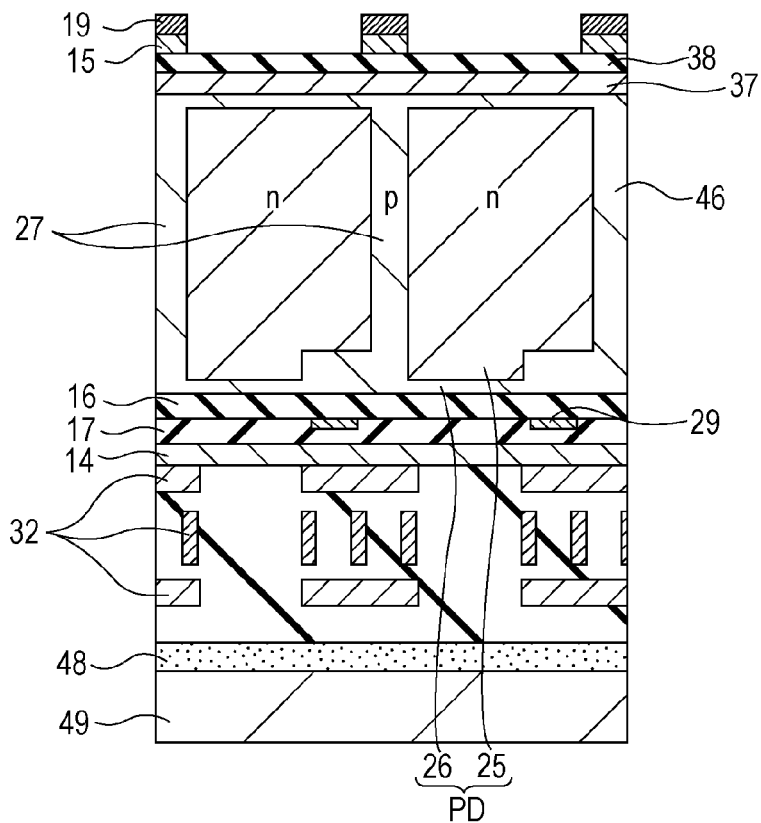

Subsequently, in order to form the opening portion for guiding visible light to the area corresponding to each photodiode PD, patterning is performed (refer to FIG. 13B). The patterning described herein is performed as follows: the contact layer 15 and the light shielding film 39 are selectively etched and removed through a resist mask (not shown in the drawings), thereby forming the contact layer 15 and the light shielding film 39 at each pixel boundary. In addition, the etching may use wet etching or dry etching. It is preferable to use dry etching since a fine line width of the light shielding film 39 is obtained with high accuracy.

Next, the planarization film 41 is formed on the oxide film 38 which includes the light shielding film 39. The planarization film 41 is formed by applying organic materials such as resin.

Then, the on-chip color filter 42 of, for example, the Bayer array and the on-chip micro lens 43 are sequentially formed on the planarization film 41. In such a manner, as shown in FIG. 10, the solid-state imaging apparatus 21 according to the third embodiment is obtained.

In the method of manufacturing the above-mentioned solid-state imaging apparatus 21 according to the third embodiment, similarly to the methods of manufacturing the solid-state imaging apparatuses according to the first and second embodiments, there is no deterioration in device characteristics caused by silicon crystal defects.

Further, this embodiment is similar to the first and second embodiments in the following respects: materials of the infrared cut filter layer are not limited; the compatibility with the semiconductor process in the related art is good; it is possible to manufacture the apparatus while suppressing an increase in the number of steps; and it can be expected to improve fabrication yield.

5. Fourth Embodiment

Configuration of Camera

Figure 14:
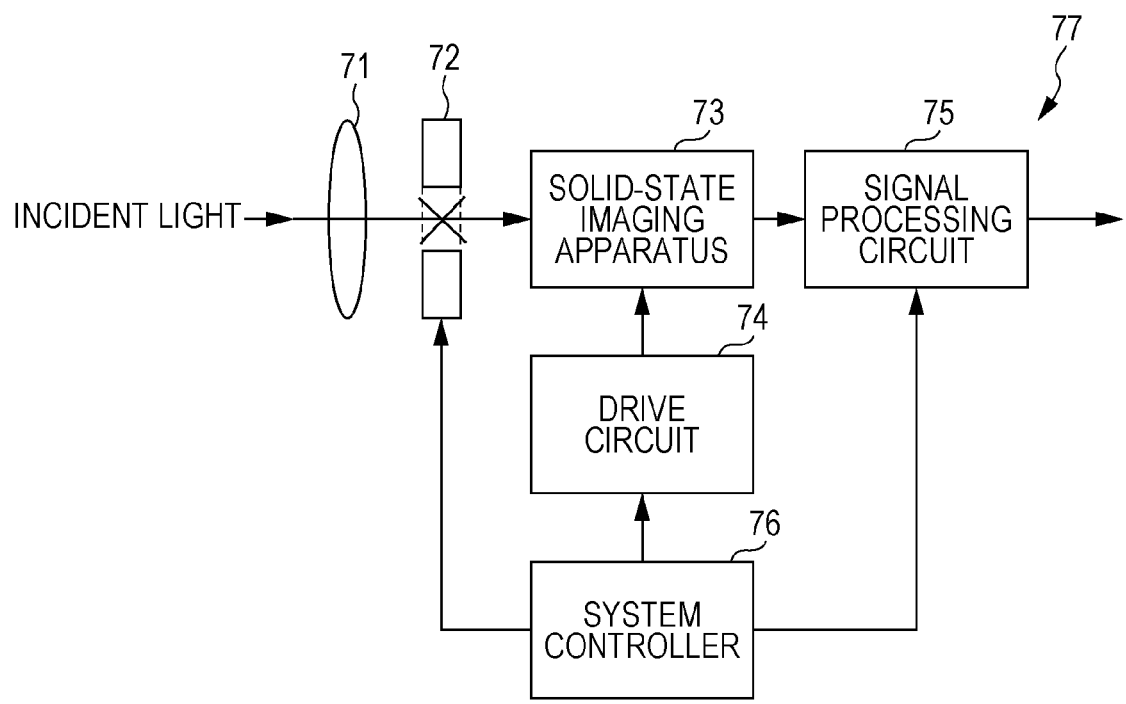
FIG. 14 is a schematic diagram illustrating a camera as an example of an image capturing apparatus according to an embodiment of the disclosure.

FIG. 14 is a schematic diagram illustrating a camera 77 as an example of an image capturing apparatus according to an embodiment of the disclosure. In the camera 77, the above-mentioned solid-state imaging apparatus according to the first to third embodiments is employed as an imaging device.

The camera 77 according to this embodiment of the disclosure is configured such that light originating from a subject (not shown in the drawing) is incident to an imaging area of a solid-state imaging apparatus 73 through an optical system such as a lens 71 and a mechanical shutter 72. Further, the mechanical shutter 72 is used for setting the exposure time by shielding the incidence of light to the imaging area of the solid-state imaging apparatus 73.

Here, as the solid-state imaging apparatus 73, the solid-state imaging apparatus 1 according to the first to third embodiments mentioned above is used, and is driven by a driving circuit 74 having a timing generation circuit, a driving system, and the like.

Further, a signal processing circuit 75 at the subsequent stage performs various types of signal processing on output signals from the solid-state imaging apparatus 73. Then, processed signals are derived as imaging signals to the outside, and the derived imaging signals are recorded in a recording medium such as a memory, or are output to a monitor.

In addition, a system controller 76 controls the opening and closing of the mechanical shutter 72, the driving circuit 74, the signal processing circuit 75, and the like.

In the camera according to the embodiment of the disclosure, the above-mentioned solid-state imaging apparatus according to the embodiment of the disclosure is employed. Hence, it is possible to sufficiently suppress color mixing, and thus it is also possible to obtain a captured image with high quality.

6. Modified Examples

Regarding Color Filter

In the first to fourth embodiments mentioned above, the case of using the color filter 42 of which the RGB colors are formed in the Bayer array is exemplified. However, in order to improve color reproducibility and achieve a high-precision solid-state imaging apparatus, an organic photoelectric conversion film may be used.

Figure 15:
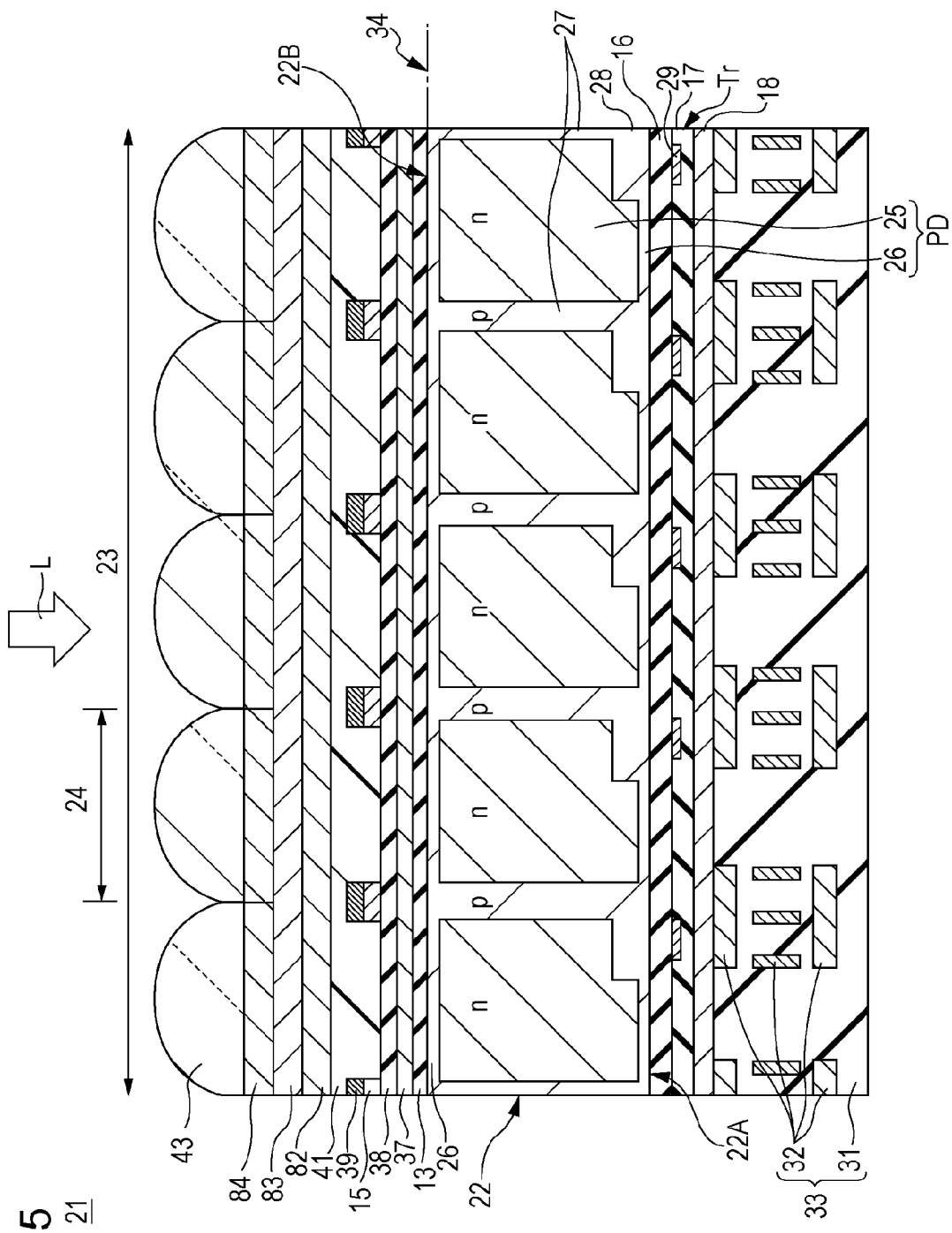
FIG. 15 is a schematic diagram illustrating a modified example of the first embodiment.

FIG. 15 is a schematic diagram illustrating a modified example of the first embodiment. In the solid-state imaging apparatus 21 described herein, the organic photoelectric conversion film 82 is formed on the upper layer of the planarization film 41, and the organic color filter layer 84 is further formed with a separating layer 83 interposed therebetween.

The organic color filter layer 84 is formed to correspond to the photodiodes PD. For example, in order to obtain blue (B) and red (R), a cyan organic color filter layer 84C and a yellow organic color filter layer 84Y are arranged in a checkered pattern. Further, the on-chip micro lens 43, which concentrates the incident light on each photodiode PD, is formed on the organic color filter layer 84.

Examples of green-based (G) pigments of the organic photoelectric conversion film 82 include a rhodamine-based pigment, a phthalocyanine derivative, quinacridone, eosin-Y, and meracyanine-based pigments, and the like.

In the solid-state imaging apparatus 21 of the modified example, the signal of green (G) is obtained from the organic photoelectric conversion film 82, and blue (B) and red (R) are obtained from the combination of the organic color filter layers 84 with cyan (C) and yellow (Y).

Figure 16A:
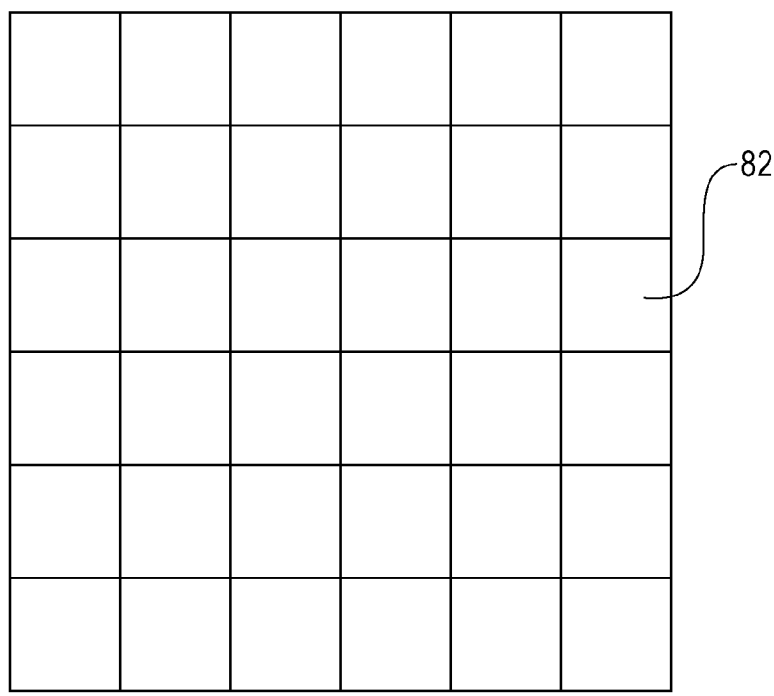
FIGS. 16A and 16B are schematic diagrams illustrating an example of a planar arrangement (coding) of an organic photoelectric conversion film and an organic color filter layer.
Figure 16B:
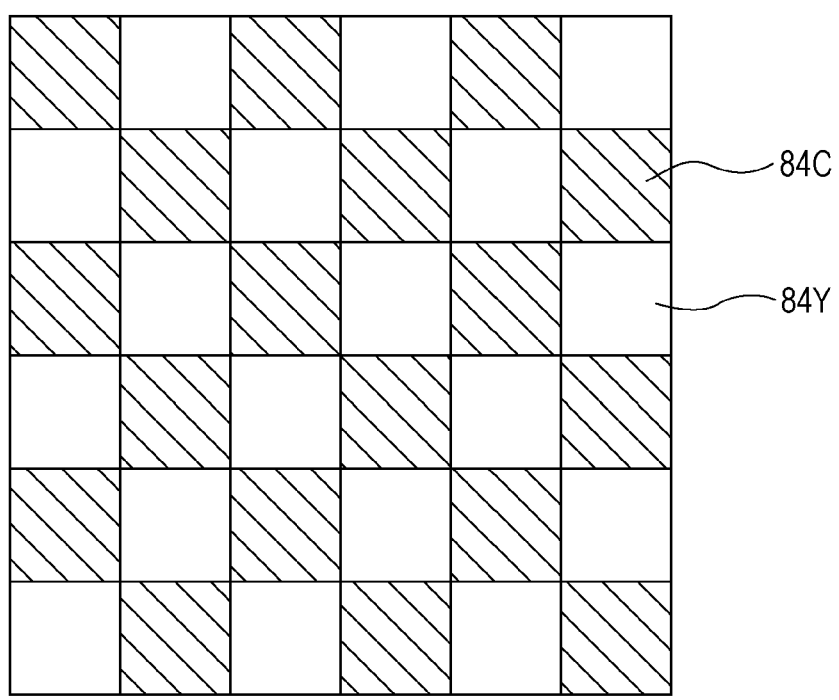

Hereinafter, FIGS. 16A and 16B show an example of a planar arrangement (coding) of the organic photoelectric conversion film 82 and the organic color filter layer 84.

As shown in FIG. 16A, green (G) obtained from the organic photoelectric conversion film 82 is disposed over all the pixels. Further, as shown in FIG. 16B, cyan (C) and yellow (Y) are formed in a so-called checkered pattern array. Dispersion of blue (B) and red (R) is achieved by the following principle.

That is, blue (B) is obtained as follows: the red (R) component is removed by absorbing cyan (C) through the organic color filter layer 84C; subsequently the green (G) component is removed by absorbing green (G) through the organic photoelectric conversion film 82; and then the blue (B) component remains.

On the other hand, red (R) is obtained as follows: the blue (B) component is removed by absorbing yellow (Y) through the organic color filter layer 84Y; subsequently the green (G) component is removed by absorbing green (G) through the organic photoelectric conversion film 82; and then the red (R) component remains.

With such a configuration, separated color signals of green (G), blue (B), and red (R) can be output.

In addition, since the cyan (C) organic color filter layer 84C and the yellow (Y) organic color filter layer 84Y are disposed in the so-called checkered pattern array, spatial luminance and chroma resolution are slightly lowered. However, it is possible to remarkably improve color reproducibility.

Regarding Semiconductor Substrate

In the first to fourth embodiments mentioned above, the description was given of, as an example, the case where the semiconductor substrate is made of silicon. However, it is not indispensable for the semiconductor substrate to be a silicon substrate, and the semiconductor substrate may be made of other semiconductor materials.

Further, in the methods of manufacturing solid-state imaging apparatuses according to the first to third embodiments mentioned above, the description was given of, as an example, the manufacturing method using the SOI substrate. However, it is not indispensable to use the SOI substrate in the manufacture thereof, and the silicon bulk substrate may be used in the manufacture thereof.

The present disclosure contains subject matter related to that disclosed in Japanese Priority Patent Application JP 2010-153640 filed in the Japan Patent Office on Jul. 6, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
    a semiconductor substrate having a light sensing portion that photoelectrically converts incident light;
    an interlayer insulation layer over a first surface of the semiconductor substrate that faces away from a second light receiving surface of the semiconductor substrate;
    a wiring layer; and
    an infrared cut filter layer between the interlayer insulation layer and the wiring layer, the infrared cut filter layer covering a surface of the interlayer insulation layer such that the infrared cut filter layer is over substantially the entire first surface of the semiconductor substrate including an area overlapping the light sensing portion.

2. The solid-state imaging device according to claim 1, wherein the infrared cut filter layer includes two laminated layers that have refractive indices different from each other.

3. The solid-state imaging device according to claim 1, wherein the infrared cut filter layer is provided with a connecting hole for connecting the wiring layer with the semiconductor substrate or gate electrodes of transistor devices that are provided on the semiconductor substrate.

4. The solid-state imaging device according to claim 1, wherein the infrared cut filter layer includes at least one of a phthalocyanine-based compound, an anthraquinone-based compound, a cyanine-based compound, a polymethylene-based compound, a diimmonium-based compound, an immonium-based compound, and an azo-based compound.

5. The solid-state imaging device according to claim 1, wherein the infrared cut filter layer includes at least one of a cyanine-based compound, a polymethylene-based compound, a diimmonium-based compound, an immonium-based compound, and an azo-based compound.

6. The solid-state imaging device according to claim 1, further comprising a gate insulation film between the first surface of the semiconductor substrate and the interlayer insulation layer.

7. A method of manufacturing a solid-state imaging device comprising:
    forming an interlayer insulation layer over a first surface of a semiconductor substrate that faces away from a second light receiving surface of the semiconductor substrate, the semiconductor substrate having a light sensing portion that photoelectrically converts incident light;
    forming an infrared cut filter layer; and
    forming a wiring layer,
    wherein,
        the infrared cut filter layer is formed between the interlayer insulation layer and the wiring layer, the infrared cut filter layer covering a surface of the interlayer insulation layer such that the infrared cut filter layer is over substantially the entire first surface of the semiconductor substrate including an area overlapping the light sensing portion.

8. The method of manufacturing the solid-state imaging device according to claim 7, wherein:
    the method further includes forming transistor devices on the semiconductor substrate, and
    the infrared cut filter layer is formed after the transistor devices are formed.

9. The method of manufacturing the solid-state imaging device according to claim 7, wherein the infrared cut filter layer includes at least one of a cyanine-based compound, a polymethylene-based compound, a diimmonium-based compound, an immonium-based compound, and an azo-based compound.

10. The method of manufacturing the solid-state imaging device according to claim 7, further comprising forming a gate insulation film, the gate insulation film being formed between the first surface of the semiconductor substrate and the interlayer insulation layer.

11. A solid-state imaging apparatus comprising:
    (a) a solid-state imaging device that includes (i) a semiconductor substrate having a light sensing portion that photoelectrically converts incident light, (ii) an interlayer insulation layer over a first surface of the semiconductor substrate that faces away from a second light receiving surface of the semiconductor substrate, (iii) a wiring layer, and (iv) an infrared cut filter layer between the interlayer insulation layer and the wiring layer, the infrared cut filter layer covering a surface of the interlayer insulation layer such that the infrared cut filter layer covers substantially the entire first surface of the semiconductor substrate including an area overlapping the light sensing portion; and (b) an optical system that concentrates the incident light on the light sensing portion.

12. The solid-state imaging apparatus according to claim 11, wherein the infrared cut filter layer includes at least one of a cyanine-based compound, a polymethylene-based compound, a diimmonium-based compound, an immonium-based compound, and an azo-based compound.

13. The solid-state imaging apparatus according to claim 11, further comprising a gate insulation film between the first surface of the semiconductor substrate and the interlayer insulation layer.

14. An image capturing apparatus comprising:

(a) a solid-state imaging device that includes (i) a semiconductor substrate having a light sensing portion that photoelectrically converts incident light, (ii) an interlayer insulation layer over a first surface of the semiconductor substrate that faces away from a second light receiving surface of the semiconductor substrate, (iii) a wiring layer, and (iv) an infrared cut filter layer between the interlayer insulation layer and the wiring layer, the infrared cut filter layer covering a surface of the interlayer insulation layer such that the infrared cut filter layer covers substantially the entire first surface of the semiconductor substrate including an area overlapping the light sensing portion;

(b) an optical system that concentrates the incident light on the light sensing portion; and (c) a signal processing section that processes signal charges that are photoelectrically converted by the light sensing portion.

15. The image capturing apparatus according to claim 14, wherein the infrared cut filter layer includes at least one of a cyanine-based compound, a polymethylene-based compound, a diimmonium-based compound, an immonium-based compound, and an azo-based compound.

16. The image capturing apparatus according to claim 14, further comprising a gate insulation film between the first surface of the semiconductor substrate and the interlayer insulation layer.

* * * * *